United States Patent
Takahashi

(10) Patent No.: US 11,245,244 B2
(45) Date of Patent: Feb. 8, 2022

(54) OPTICAL MODULE AND METHOD FOR MANUFACTURING THE SAME

(71) Applicant: FUJIKURA LTD., Tokyo (JP)

(72) Inventor: Akari Takahashi, Sakura (JP)

(73) Assignee: Fujikura Ltd., Tokyo (JP)

(*) Notice: Subject to any disclaimer, the term of this patent is extended or adjusted under 35 U.S.C. 154(b) by 139 days.

(21) Appl. No.: 16/620,085

(22) PCT Filed: May 17, 2018

(86) PCT No.: PCT/JP2018/019035
§ 371 (c)(1),
(2) Date: Dec. 6, 2019

(87) PCT Pub. No.: WO2019/008918
PCT Pub. Date: Jan. 10, 2019

(65) Prior Publication Data
US 2020/0153198 A1 May 14, 2020

(30) Foreign Application Priority Data
Jul. 6, 2017 (JP) .............................. JP2017-132965

(51) Int. Cl.
*H01S 5/02234* (2021.01)
*H01S 5/02208* (2021.01)
*H01S 5/02326* (2021.01)

(52) U.S. Cl.
CPC ...... *H01S 5/02234* (2021.01); *H01S 5/02208* (2013.01); *H01S 5/02326* (2021.01)

(58) Field of Classification Search
CPC .. H01S 5/02234; H01S 5/022; H01S 5/02326; H01S 5/02208; H01S 5/0231;
(Continued)

(56) References Cited

U.S. PATENT DOCUMENTS

| | | | |
|---|---|---|---|
| 2005/0058167 A1* | 3/2005 | Kuramachi | .......... G02B 6/4206 372/43.01 |
| 2012/0033695 A1* | 2/2012 | Hayashi | ............. H01S 5/02235 372/43.01 |
| 2018/0019569 A1 | 1/2018 | Law et al. | |

FOREIGN PATENT DOCUMENTS

| | | | | |
|---|---|---|---|---|
| JP | 2005347341 A | | 12/2005 | |
| JP | 2010050406 | * | 3/2010 | ............. H01L 23/02 |

(Continued)

OTHER PUBLICATIONS

Supplementary European Search Report issued in corresponding European Patent Application No. 18828496.2, dated Dec. 9, 2020 (6 pages).

*Primary Examiner* — Tuan N Nguyen

(74) *Attorney, Agent, or Firm* — Osha Bergman Watanabe & Burton LLP

(57) ABSTRACT

An optical module includes: an optical component; a base portion on which the optical component is mounted; a housing that includes sidewalls extending from the base portion in a height direction to surround the base portion; a cover member that defines, along with the housing, an accommodation space in which the optical component is disposed; and a resin for fixing the housing to the cover member. The cover member includes: an opposing surface that faces the base portion of the housing in the height direction; a first lateral cover surface extending along the height direction; and a second lateral cover surface extending in the height direction. The second lateral cover surface is disposed on an opposite side of the first lateral cover surface.

18 Claims, 16 Drawing Sheets

(58) Field of Classification Search
CPC . H01S 5/0282; H01L 31/02; H01L 2224/245; G02B 7/00
See application file for complete search history.

(56) References Cited

FOREIGN PATENT DOCUMENTS

| | | | | |
|---|---|---|---|---|
| JP | 2010050406 A | | 3/2010 | |
| JP | 2015130394 | * | 7/2015 | ............ H01L 23/02 |
| JP | 2015130394 A | | 7/2015 | |
| TW | I583086 B | | 5/2017 | |
| WO | 2013077199 A1 | | 5/2013 | |

* cited by examiner

OPTICAL MODULE AND METHOD FOR MANUFACTURING THE SAME

CROSS-REFERENCE TO RELATED APPLICATIONS

This application claims benefit of priority from Japanese Patent Application No. 2017-132965 filed on Jul. 6, 2017, the disclosure of which is incorporated herein by reference in its entirety.

TECHNICAL FIELD

The present invention relates to an optical module and a method of manufacturing the same, and more particularly to an optical module having a housing including an optical component mounted thereon.

BACKGROUND

There has heretofore been known an optical module having a housing including an optical component mounted thereon and a cover member attached to the housing. As an example of such an optical module, a laser module 901 as illustrated in FIG. 1 has been known in the art (see, e.g., Patent Literature 1). The laser module 901 includes a housing 910 having an opening portion formed therein and a cover member 920 that covers the opening portion of the housing 910. The housing 910 includes a base portion 911 and a sidewall 912 extending from an edge portion of the base portion 911. The sidewall 912 has a recessed portion 913 formed at a top thereof. Meanwhile, the cover member 920 has a projection portion 921 formed at an edge portion of the cover member 920 so as to project toward the sidewall 912 correspondingly to the recessed portion 913. The cover member 920 is placed on the sidewall 912 of the housing 910 so that the projection portion 921 is received in the recessed portion 913.

A resin 930 is formed between the projection portion 921 and the recessed portion 913. The resin 930 is used to seal a gap between the projection portion 921 and the recessed portion 913 and also to fix the cover member 920 onto the housing 910. An accommodation space S in which an optical component is placed is formed between the housing 910 and the cover member 920. For example, optical components such as a semiconductor laser device 941 operable to emit a laser beam, an optical fiber 943, an optical coupling means 940 including lenses 942 and 944 for optically coupling the laser beam to the optical fiber 943 are placed in the accommodation space S.

In this laser module 901, the resin 930 seals the gap between the housing 910 and the cover member 920. When the resin 930 expands due to moisture absorption, the resin 930 deforms so that the housing 910 is strongly pressed as illustrated by arrows in FIG. 1. Thus, the housing 910 deforms as a result. If the housing 910 deforms in this manner, the optical components fixed to the housing 910 changes in position so that an optical axis of the laser beam is misaligned. Therefore, the optical characteristics of the laser module 901 are deteriorated.

PATENT LITERATURE

Patent Literature 1: JP 2015-130394 A

SUMMARY

One or more embodiments of the present invention provide an optical module capable of maintaining optical characteristics of an optical component placed in an accommodation space.

Furthermore, one or more embodiments of the present invention provide a method of manufacturing an optical module capable of maintaining optical characteristics of an optical component placed in an accommodation space while it allows a cover member to be positioned with accuracy.

According to one or more embodiments of the present invention, there is provided an optical module capable of maintaining optical characteristics of an optical component placed in an accommodation space. The optical module has an optical component, a base portion on which the optical component is mounted, a housing including sidewalls extending from the base portion in a height direction so as to surround the base portion, a cover member that defines, along with the housing, an accommodation space in which the optical component is placed, and a resin for fixing the housing and the cover member to each other. The cover member includes an opposing surface opposed to the base portion of the housing in the height direction, a first lateral cover surface extending along the height direction, and a second lateral cover surface extending along the height direction and being located on an opposite side of the first lateral cover surface. The sidewalls include a first sidewall including a counter portion having a lateral counter surface extending along the height direction and a second sidewall opposed to the first sidewall. The second sidewall includes a cover support surface for supporting the cover member. In at least one cross-section among cross-sections of the optical module on a plane parallel to both of a first direction perpendicular to the height direction and the height direction, the lateral counter surface of the counter portion of the first sidewall and the first lateral cover surface are opposed to each other while the resin is interposed therebetween, the second lateral cover surface of the cover member is exposed to an outside, and the cover support surface of the second sidewall and the opposing surface of the cover member are opposed to each other. An ultraviolet curable resin may be used for the resin.

In the specification, what is meant by the lateral cover surface exposed to an outside is that the lateral cover surface faces an external space while no resin is present outside of the lateral cover surface, or while, if a housing is located outside of the lateral cover surface, no resin is present between the lateral cover surface and the housing.

With an optical module according to one or more embodiments of the present invention, in at least one cross-section among cross-sections of the optical module on a plane parallel to both of the first direction and the height direction, the lateral counter surface of the counter portion of the first sidewall and the first lateral cover surface are opposed to each other while the resin is interposed therebetween, the cover support surface of the second sidewall and the opposing surface of the cover member are opposed to each other, and the second lateral cover surface of the cover member, which is on an opposite side of the first lateral cover surface, is exposed to an outside. In other words, the resin is provided only on one side of the cover member (on the first lateral cover surface) in the first direction, and the second lateral cover surface, which is on an opposite side of the first lateral cover surface, is exposed to the outside. Therefore, the resin located between the lateral counter surface of the counter portion of the first sidewall and the first lateral cover surface of the cover member can deform without any restriction in the first direction. Accordingly, when the resin located between the lateral counter surface of the counter portion of the first sidewall and the first lateral cover surface of the cover member expands or shrinks in the first direction, deformation of the resin exerts less influence on the housing. Thus, the housing is prevented from deforming. As a result, the optical characteristics of the optical component placed in the accommodation space within the housing are prevented from being deteriorated.

The lateral counter surface and the first lateral cover surface of the cover member may be opposed to each other over an overall length of the lateral counter surface of the counter portion of the first sidewall while the resin is interposed therebetween. The second lateral cover surface may be exposed to an outside over an overall length of the second lateral cover surface located on an opposite side of the first lateral cover surface. In this case, the advantageous effect of preventing deformation of the housing can be attained over the overall length of the first sidewall.

The cover member may further include a third lateral cover surface extending along the height direction and a fourth lateral cover surface extending along the height direction and being located on an opposite side of the third lateral cover surface. In this case, the sidewall may further include a third sidewall including a counter portion having a lateral counter surface extending along the height direction and a fourth sidewall opposed to the third sidewall. The fourth sidewall may include a cover support surface for supporting the cover member. In at least one cross-section among cross-sections of the optical module on a plane parallel to both of a second direction perpendicular to the height direction and the height direction, the lateral counter surface of the counter portion of the third sidewall and the third lateral cover surface of the cover member may be opposed to each other while the resin is interposed therebetween. The fourth lateral cover surface of the cover member may be exposed to an outside, and the cover support surface of the fourth sidewall and the opposing surface of the cover member may be opposed to each other.

With this configuration, in at least one cross-section among cross-sections of the optical module on a plane parallel to both of the second direction and the height direction, the lateral counter surface of the counter portion of the third sidewall and the third lateral cover surface of the cover member are opposed to each other while the resin is interposed therebetween, the cover support surface of the fourth sidewall and the opposing surface of the cover member are opposed to each other, and the fourth lateral cover surface of the cover member, which is on an opposite side of the third lateral cover surface, is exposed to an outside. In other words, the resin is provided only on one side of the cover member (on the third lateral cover surface) in the second direction, and the fourth lateral cover surface, which is on an opposite side of the third lateral cover surface, is exposed to the outside. Therefore, the resin located between the lateral counter surface of the counter portion of the third sidewall and the third lateral cover surface of the cover member can deform without any restriction in the second direction. Accordingly, when the resin located between the lateral counter surface of the counter portion of the third sidewall and the third lateral cover surface of the cover member expands or shrinks in the second direction, deformation of the resin exerts less influence on the housing. Thus, the housing is prevented from deforming. As a result, the optical characteristics of the optical component placed in the accommodation space within the housing are prevented from being deteriorated.

The lateral counter surface and the third lateral cover surface of the cover member may be opposed to each other over an overall length of the lateral counter surface of the counter portion of the third sidewall while the resin is interposed therebetween, and the fourth lateral cover surface may be exposed to an outside over an overall length of the fourth lateral cover surface located on an opposite side of the third lateral cover surface. In this case, the advantageous effect of preventing deformation of the housing can be attained over the overall length of the third sidewall.

The first sidewall and the third sidewall may be located adjacent to each other. In this case, the counter portion of the first sidewall may extend along the first sidewall from a connected portion of the first sidewall and the third sidewall, and the counter portion of the third sidewall may extend along the third sidewall from the connected portion.

The housing may further include a counter corner portion (counter corner) opposed to at least one corner portion (corner) of the cover member. Provision of such a counter corner portion allows the cover member to be positioned more accurately.

Furthermore, a thickness of the second lateral cover surface of the cover member along the height direction may be less than a thickness of the first lateral cover surface along the height direction. When the thickness of the cover member is partially reduced in the height direction, the weight of the optical module can be reduced.

According to one or more embodiments of the present invention, there is provided a method of manufacturing an optical module capable of maintaining optical characteristics of an optical component placed in an accommodation space while it allows a cover member to be positioned with accuracy. In this method, a cover member including an opposing surface, a first lateral cover surface perpendicular to the opposing surface, and a second lateral cover surface perpendicular to the opposing surface and being located on an opposite side of the first lateral cover surface is prepared. A housing including a base portion and sidewalls extending from the base portion in a height direction so as to surround the base portion is prepared. The sidewalls include a first sidewall including a counter portion having a lateral counter surface extending along the height direction and a second sidewall opposed to the first sidewall. The second sidewall includes a cover support surface for supporting the cover member. An optical component is mounted on the base portion of the housing. A resin is applied to a resin application area of the housing that includes the lateral counter surface of the counter portion of the base portion in at least one cross-section among cross-sections of the housing on a plane parallel to both of a first direction perpendicular to the height direction and the height direction. The cover member is placed so as to face the lateral counter surface of the counter portion of the first sidewall in a state in which the opposing surface of the cover member is opposed to the base portion on which the optical component has been mounted to bring the first lateral cover surface of the cover member into contact with the resin applied to the lateral counter surface, and the cover member is also placed so as to face the cover support surface of the second sidewall. The resin is cured in a state in which the first lateral cover surface of the cover member is brought into contact with the resin applied to the lateral counter surface of the counter portion of the first sidewall.

With a method of manufacturing an optical module according to one or more embodiments of the present invention, the cover member can be positioned in the first direction by placing the cover member so as to face the lateral counter surface of the counter portion of the first sidewall. Furthermore, the resin is provided only on one side of the cover member (on the first lateral cover surface) in the first direction, and the second lateral cover surface, which is on an opposite side of the first lateral cover surface, is exposed to the outside. Therefore, the resin located between the lateral counter surface of the counter portion of the first sidewall and the first lateral cover surface of the cover member can deform without any restriction in the first direction. Accordingly, when the resin located between the lateral counter surface of the counter portion of the first sidewall and the first lateral cover surface of the cover member expands or shrinks in the first direction, deformation of the resin exerts less influence on the housing. Thus, the housing is prevented from deforming. As a result, the optical characteristics of the optical component placed in the accommodation space within the housing are prevented from being deteriorated.

The cover member may further include a third lateral cover surface extending along the height direction and a fourth lateral cover surface extending along the height direction and being located on an opposite side of the third lateral cover surface. The sidewalls may further include a third sidewall including a counter portion having a lateral counter surface extending along the height direction and a fourth sidewall opposed to the third sidewall. The fourth sidewall may include a cover support surface for supporting the cover member. In this case, the resin application area further includes the lateral counter surface of the counter portion of the third sidewall in at least one cross-section among cross-sections of the housing on a plane parallel to both of a second direction perpendicular to the height direction and the height direction. The placing the cover member so as to face the lateral counter surface of the counter portion of the first sidewall and also placing the cover member so as to face the cover support surface of the second sidewall may comprise placing the cover member so as to face the lateral counter surface of the counter portion of the third sidewall to bring the third lateral cover surface of the cover member into contact with the resin applied to the lateral counter surface and also placing the cover member so as to face the cover support surface of the fourth sidewall. The curing the resin may comprise bringing the third lateral cover surface of the cover member into contact with the resin applied to the lateral counter surface of the counter portion of the third sidewall.

The cover member can be positioned in the second direction by placing the cover member so as to face the lateral counter surface of the counter portion of the third sidewall. Thus, the cover member can be positioned in two directions including the first direction and the second direction. Furthermore, the resin is provided only on one side of the cover member (on the third lateral cover surface) in the second direction, and the fourth lateral cover surface, which is on an opposite side of the third lateral cover surface, is exposed to the outside. Therefore, the resin located between the lateral counter surface of the counter portion of the third sidewall and the third lateral cover surface of the cover member can deform without any restriction in the second direction. Accordingly, when the resin located between the lateral counter surface of the counter portion of the third sidewall and the third lateral cover surface of the cover member expands or shrinks in the second direction, deformation of the resin exerts less influence on the housing. Thus, the housing is prevented from deforming. As a result, the optical characteristics of the optical component placed in the accommodation space within the housing are prevented from being deteriorated.

An ultraviolet curable resin may be used for the resin. The resin may be cured by irradiating ultraviolet rays into the resin. According to one or more embodiments of the present invention, a sealing member between the sidewalls and the cover member can be arranged so as to extend along a plane toward an inside of the housing from a portion where it is exposed to the outside. Therefore, by irradiation along the plane from the outside, ultraviolet rays can be introduced into the interior of the resin. Accordingly, an ultraviolet curable resin, which can achieve short-time curing, can be used as the resin. Thus, a throughput for manufacturing the optical module can be improved.

One or more embodiments of the present invention provide an optical module capable of maintaining optical characteristics of an optical component placed in an accommodation space. Furthermore, there is provided a method of manufacturing an optical module capable of maintaining optical characteristics of an optical component placed in an accommodation space while it allows a cover member to be positioned with accuracy.

DETAILED DESCRIPTION

Figure 1:
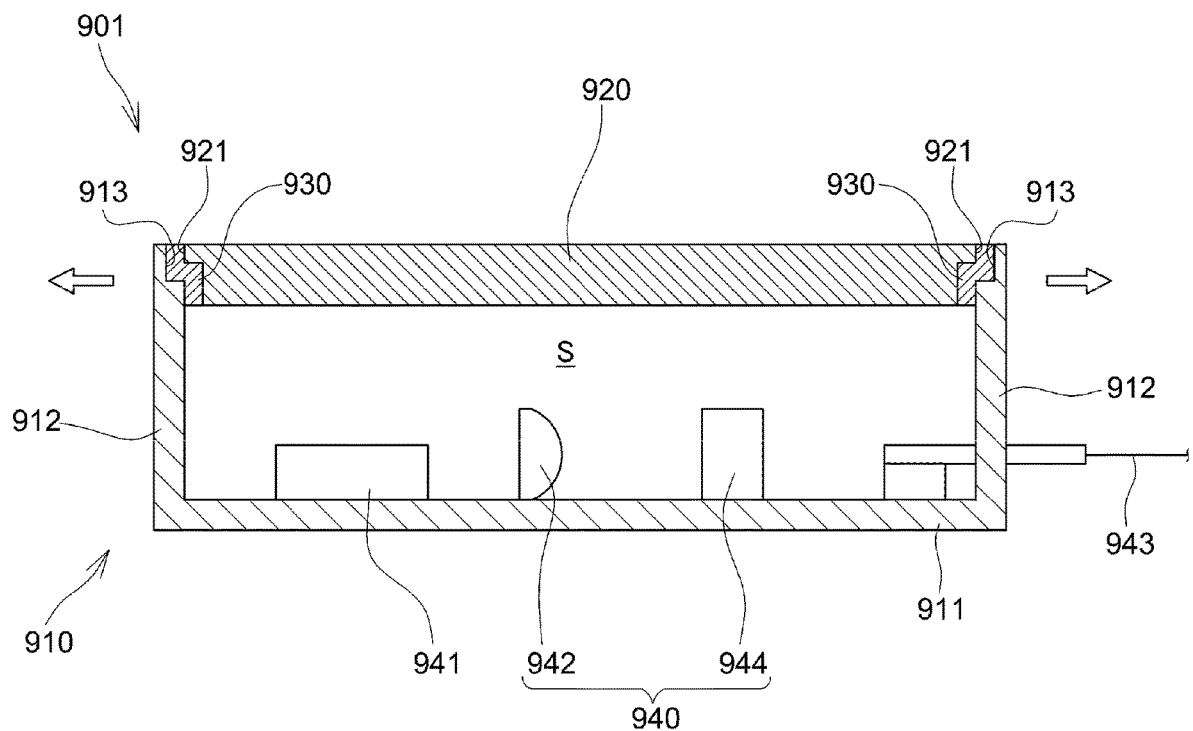
FIG. 1 is a schematic cross-sectional view showing an example of a conventional optical module.

Embodiments of an optical module according to the present invention will be described in detail below with reference to FIGS. 2 to 14. In the following, a laser module using a semiconductor laser device will be described as an example of an optical module according to the present invention. Nevertheless, the present invention is applicable to an optical module using any optical component other than a semiconductor laser device. In FIGS. 2 to 14, the same or corresponding components are denoted by the same or corresponding reference numerals and will not be described below repetitively. Furthermore, in FIGS. 2 to 14, the scales or dimensions of components may be exaggerated, or some components may be omitted.

Figure 2:
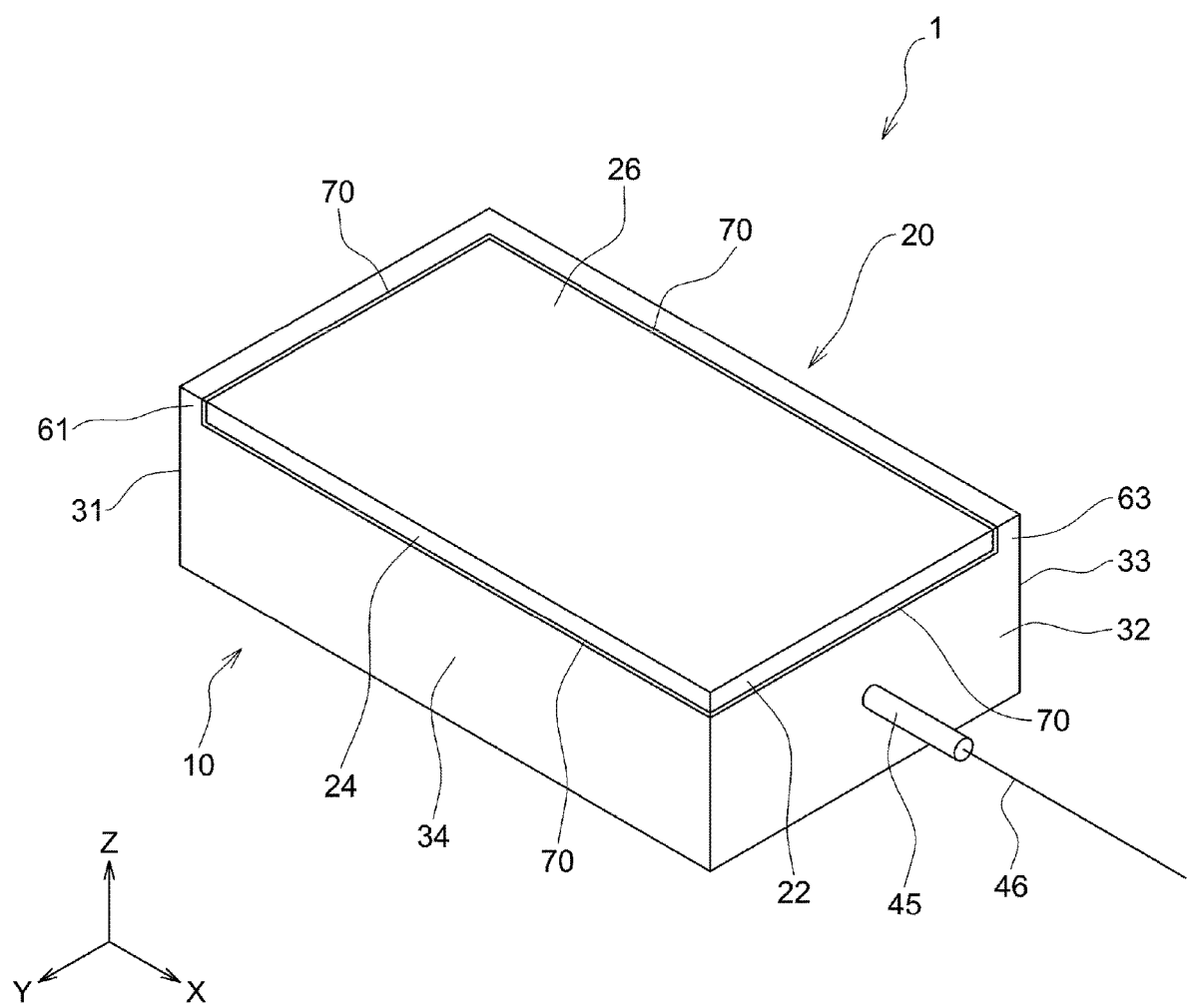
FIG. 2 is a perspective view showing a laser module as an optical module according to one or more embodiments of the present invention.
Figure 3:
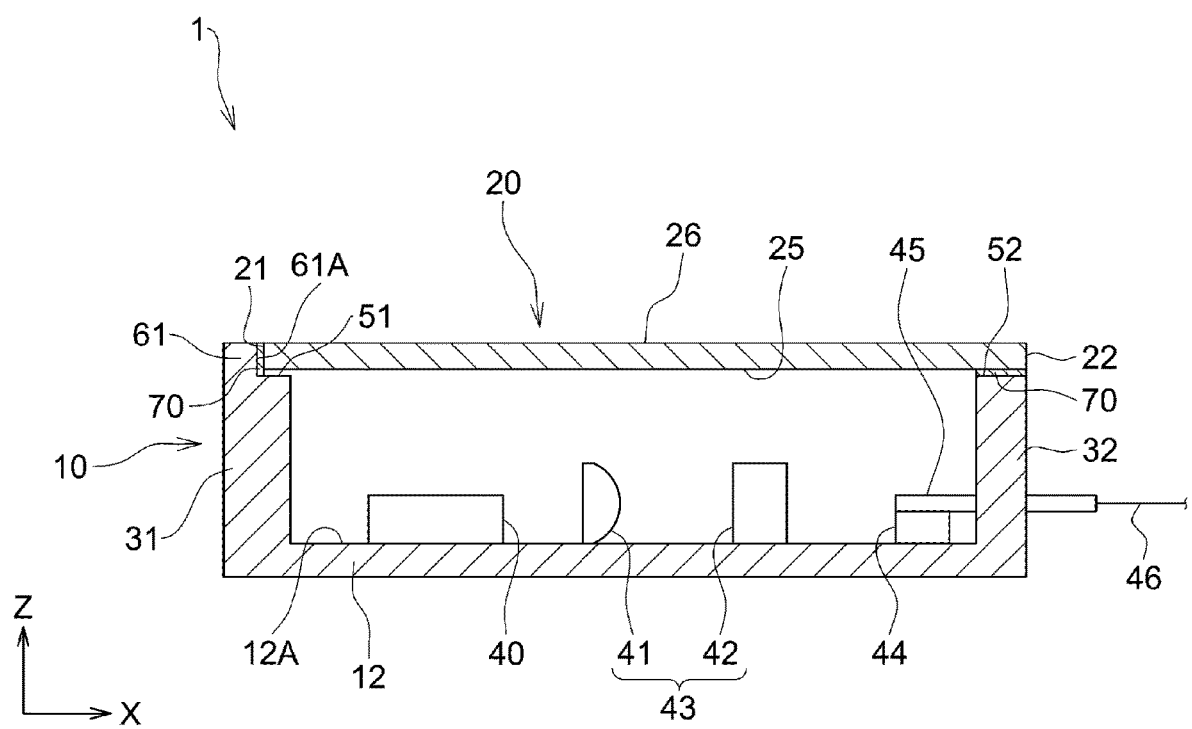
FIG. 3 is a schematic cross-sectional view of the laser module shown in FIG. 2.

FIG. 2 is a perspective view showing a laser module 1 as an optical module according to one or more embodiments of the present invention, and FIG. 3 is a schematic cross-sectional view of the laser module 1. As shown in FIGS. 2 and 3, the laser module 1 includes a housing 10 in the form of a generally rectangular parallelepiped, which is opened in the +Z-direction, and a cover member 20 in the form of a generally flat plate. The housing 10 includes a base portion 12 in the form of a flat plate and sidewalls 31-34 extending from the base portion 12 in the Z-direction (height direction) so as to surround the base portion 12. An opening portion of the housing 10, which is in the form of a generally rectangular parallelepiped, is covered with the cover member 20 to form an accommodation space S within the housing 10. The base portion 12 may be placed on a heat sink, which is not illustrated. Alternatively, the base portion 12 may include one or more water-cooled tubes.

Optical components are fixed on a front surface 12A of the base portion 12 of the housing 10. In an example illustrated in FIG. 3, a semiconductor laser device 40 and optical coupling means 43 including lenses 41 and 42 are fixed as optical components on the front surface 12A of the base portion 12. Furthermore, a ferrule fixation portion 44 is also fixed on the front surface 12A of the base portion 12. A ferrule 45 is placed on the ferrule fixation portion 44. The ferrule 45 holds an optical fiber 46 as an optical component. Those components are placed in the accommodation space S within the housing 10. Those components are fixed to the base portion 12 of the housing 10 or to the ferrule fixation portion 44 with, for example, an adhesive material.

Figure 4:
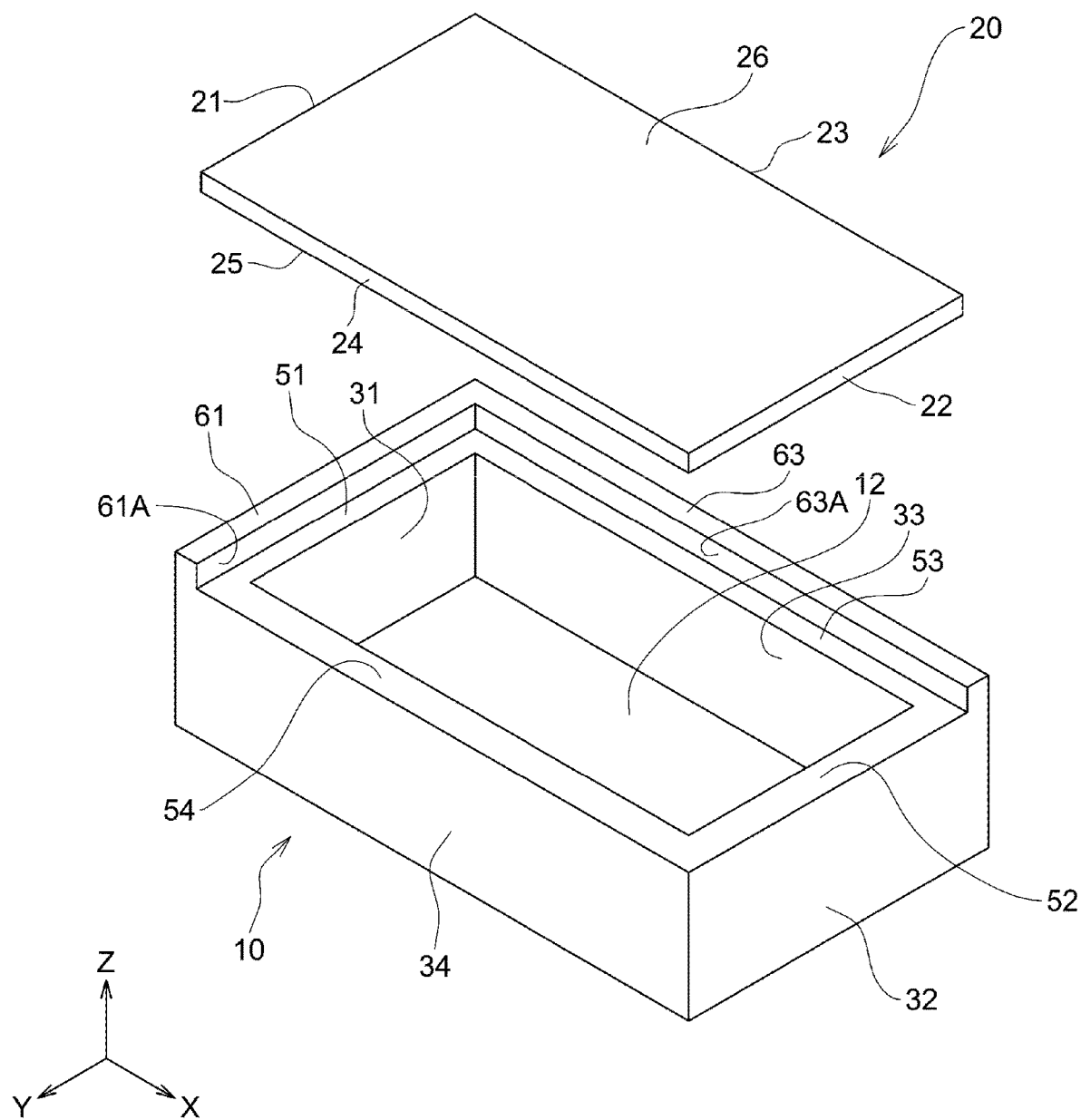
FIG. 4 is an exploded perspective view of a portion of the laser module shown in FIG. 2.

FIG. 4 is a perspective view of the laser module 1 when the housing 10 and the cover member 20 are disassembled. For the sake of simplification, the aforementioned components 40-46 are omitted from the illustration. As shown in FIG. 4, the sidewall 31 (first sidewall) has a cover support surface 51 for supporting the cover member 20 and a counter portion 61 extending in the +Z-direction from an outside (−X side) of the cover support surface 51. The counter portion 61 has a lateral counter surface 61A extending in the +Z-direction from the cover support surface 51 and in parallel to the YZ-plane. The sidewall 32 (second sidewall) has a cover support surface 52 on its top for supporting the cover member 20. The sidewall 33 (third sidewall) has a cover support surface 53 for supporting the cover member 20 and a counter portion 63 extending in the +Z-direction from an outside (−Y side) of the cover support surface 53. The counter portion 63 has a lateral counter surface 63A extending in the +Z-direction from the cover support surface 53 and in parallel to the XZ-plane. The sidewall 34 (fourth sidewall) has a cover support surface 54 on its top for supporting the cover member 20.

The sidewall 31 and the sidewall 32 are opposed to each other in the X-direction. The sidewall 33 and the sidewall 34 are opposed to each other in the Y-direction. The sidewall 31 and the sidewall 33 are located adjacent to each other. The counter portion 61 of the sidewall 31 and the counter portion 63 of the sidewall 33 intersect each other at a connected portion of the sidewall 31 and the sidewall 33. Specifically, the counter portion 61 of the sidewall 31 extends in the +Y-direction from the connected portion of the sidewall 31 and the sidewall 33 over the overall length of the sidewall 31. The counter portion 63 of the sidewall 33 extends in the +X-direction from the connected portion of the sidewall 31 and the sidewall 33 over the overall length of the sidewall 33.

As shown in FIGS. 3 and 4, the cover member 20 has four lateral cover surfaces 21-24 extending in the Z-direction, an opposing surface 25 opposed to the base portion 12 of the housing 10 in the Z-direction, and a front surface 26 located on an opposite side of the opposing surface 25 in the Z-direction. The lateral cover surface 21 (first lateral cover surface) and the lateral cover surface 22 (second lateral cover surface) are in parallel to the YZ-plane and are opposed to each other in the X-direction. Furthermore, the lateral cover surface 23 (third lateral cover surface) and the lateral cover surface 24 (fourth lateral cover surface) are in parallel to the XZ-plane and are opposed to each other in the Y-direction.

As shown in FIG. 2, a resin 70 is disposed between the sidewalls 31-34 of the housing 10 and the cover member 20 over the whole circumference of the housing 10. More specifically, the resin 70 is provided continuously between a lateral counter surface 61A of the counter portion 61 of the sidewall 31 (see FIG. 4) and the lateral cover surface 21 of the cover member 20 (see FIG. 4), between a lateral counter surface 63A of the counter portion 63 of the sidewall 33 (FIG. 4) and the lateral cover surface 23 of the cover member 20 (see FIG. 4), between the cover support surface 52 of the sidewall 32 (see FIG. 4) and the opposing surface 25 of the cover member 20 (see FIG. 3), and between the cover support surface 54 of the sidewall 34 (see FIG. 4) and the opposing surface 25 of the cover member 20 (see FIG. 3).

In this laser module 1, if moisture gets into the accommodation space S in which the optical components have been placed, then the adhesive material that fixes the optical components to the housing 10 may be deteriorated by hydrolysis, resulting in lowered adhesive strength. Alternatively, dew condensation may be caused in the accommodation space S so as to deteriorate the optical characteristics of the optical components. Therefore, it is important to sufficiently seal the accommodation space S within the laser module 1. According to one or more embodiments, as described above, the resin 70 is disposed between the sidewalls 31-34 of the housing 10 and the cover member 20 over the whole circumference of the housing 10. Accordingly, the resin 70 allows the accommodation space S in the laser module 1 to be sealed for moisture prevention. Examples of the resin 70 include ultraviolet curable resin, which will be described later, heat curable resin, moisture curable resin, anaerobic curable resin, and the like.

According to one or more embodiments, for example, with regard to the XZ-plane as shown in FIG. 3, the lateral counter surface 61A of the counter portion 61 of the sidewall 31 and the lateral cover surface 21 of the cover member 20 are opposed to each other while the resin 70 is interposed therebetween. The cover support surface 52 of the sidewall 32 and the opposing surface 25 of the cover member 20 are opposed to each other while the resin 70 is interposed therebetween. The lateral cover surface 22 of the cover member 20, which is on an opposite side of the lateral cover surface 21, is exposed to an outside. In other words, the resin 70 is provided only on one side of the cover member 20 (on the lateral cover surface 21) in the X-direction, and the lateral cover surface 22, which is on an opposite side of the lateral cover surface 21, is exposed to the outside. Therefore, the resin 70 located between the lateral counter surface 61A of the counter portion 61 of the sidewall 31 and the lateral cover surface 21 of the cover member 20 can deform without any restriction in the X-direction. Accordingly, when the resin 70 located between the lateral counter surface 61A of the counter portion 61 of the sidewall 31 and the lateral cover surface 21 of the cover member 20 expands or shrinks in the X-direction, deformation of the resin 70 exerts less influence on the housing 10. Thus, the housing 10 is prevented from deforming. As a result, the optical characteristics of the optical components placed in the accommodation space S within the housing 10 are prevented from being deteriorated.

Furthermore, those advantageous effects can also be attained with regard to the YZ-plane. Specifically, the lateral counter surface 63A of the counter portion 63 of the sidewall 33 and the lateral cover surface 23 of the cover member 20 are opposed to each other while the resin 70 is interposed therebetween. The cover support surface 54 of the sidewall 34 and the opposing surface 25 of the cover member 20 are opposed to each other while the resin 70 is interposed therebetween. The lateral cover surface 24 of the cover member 20, which is on an opposite side of the lateral cover surface 23, is exposed to an outside. In other words, the resin 70 is provided only on one side of the cover member 20 (on the lateral cover surface 23) in the Y-direction, and the lateral cover surface 24, which is on an opposite side of the lateral cover surface 23, is exposed to the outside. Therefore, the resin 70 located between the lateral counter surface 63A of the counter portion 63 of the sidewall 33 and the lateral cover surface 23 of the cover member 20 can deform without any restriction in the Y-direction. Accordingly, when the resin 70 located between the lateral counter surface 63A of the counter portion 63 of the sidewall 33 and the lateral cover surface 23 of the cover member 20 expands or shrinks in the Y-direction, deformation of the resin 70 exerts less influence on the housing 10. Thus, the housing 10 is prevented from deforming. As a result, the optical characteristics of the optical components placed in the accommodation space S within the housing 10 are prevented from being deteriorated.

Particularly, according to one or more embodiments, the lateral counter surface 61A and the lateral cover surface 21 of the cover member 20 are opposed to each other over the overall length of the lateral counter surface 61A of the counter portion 61 of the sidewall 31 in the Y-direction while the resin 70 is interposed therebetween. The lateral cover surface 22 opposite to the lateral cover surface 21 is exposed to the outside over the overall length of the lateral cover surface 22 in the Y-direction. Therefore, the advantageous effect of preventing deformation of the housing 10 can be attained over the overall length of the sidewall 31 in the Y-direction. Similarly, the lateral counter surface 63A and the lateral cover surface 23 of the cover member 20 are opposed to each other over the overall length of the lateral counter surface 63A of the counter portion 63 of the sidewall 33 in the X-direction while the resin 70 is interposed therebetween. The lateral cover surface 24 opposite to the lateral cover surface 23 is exposed to the outside over the overall length of the lateral cover surface 24 in the X-direction. Therefore, the advantageous effect of preventing deformation of the housing 10 can be attained over the overall length of the sidewall 33 in the X-direction.

Since the influence of deformation of the resin 70 on the housing 10 can thus be reduced, a hard resin can be used as the resin 70. Resins having a low moisture permeability generally tend to be hard. According to one or more embodiments, such a resin having a low moisture permeability can be used as the resin 70. When such a resin having a low moisture permeability is used as the resin 70, moisture prevention can be enhanced for the accommodation space S within the laser module 1.

Figure 5A:
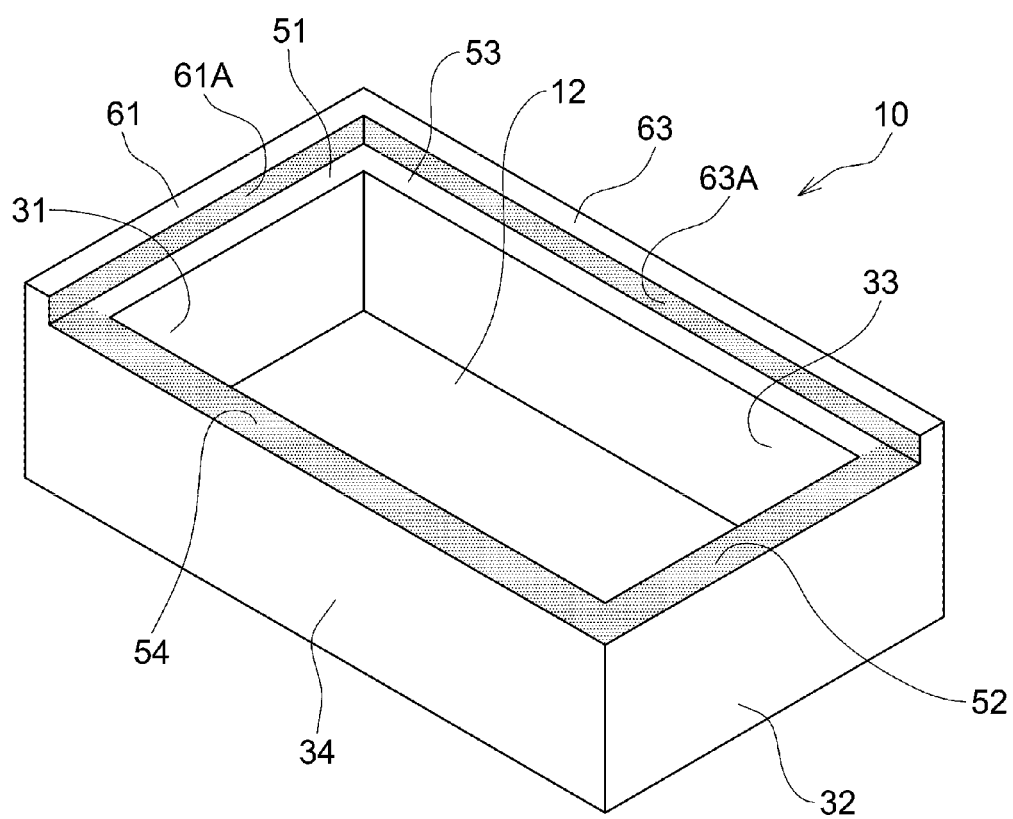
FIG. 5A is a perspective view explanatory of a process of assembling a laser module shown in FIG. 2.
Figure 5B:
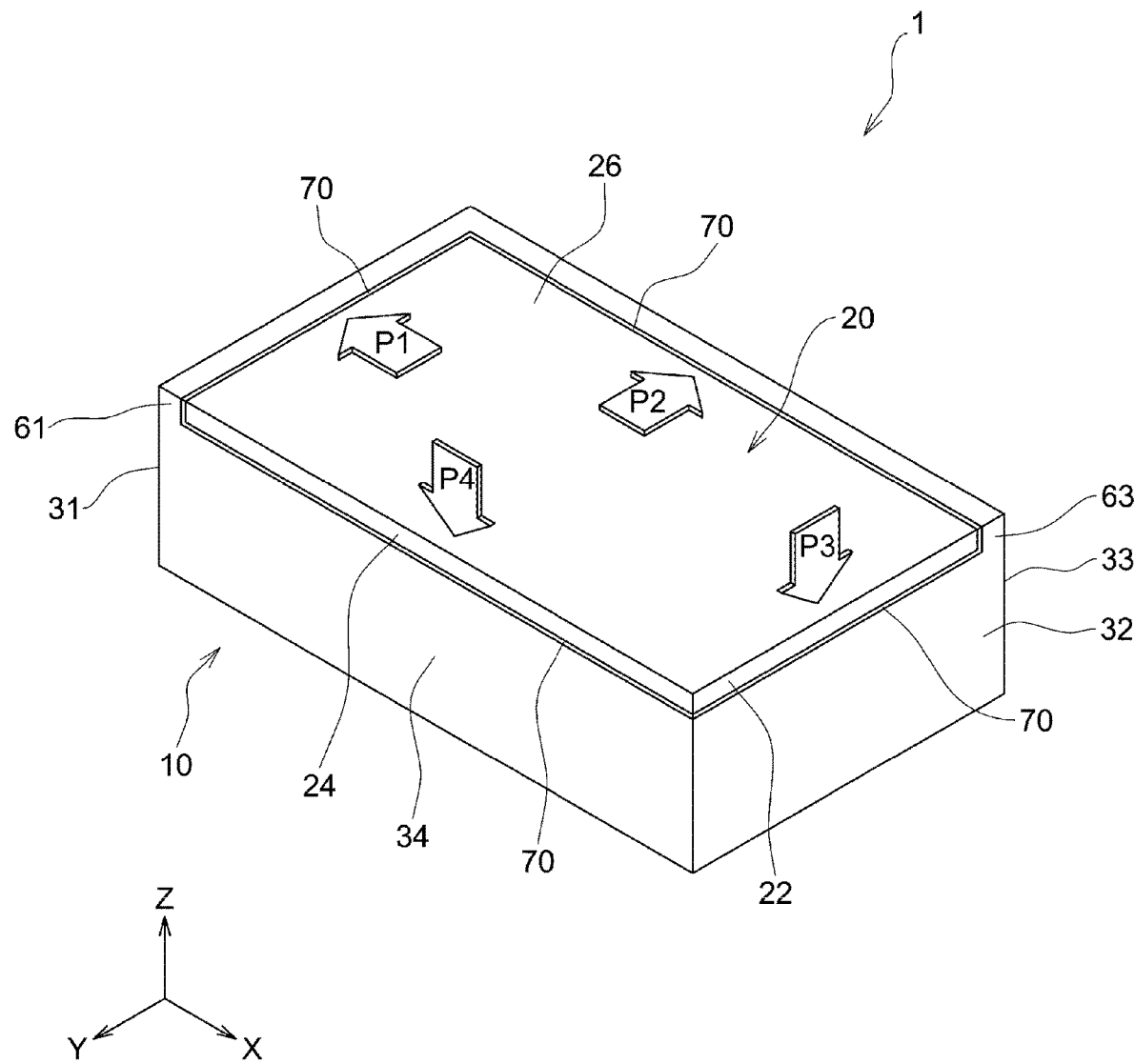
FIG. 5B is a perspective view explanatory of a process of assembling a laser module shown in FIG. 2.
Figure 5C:
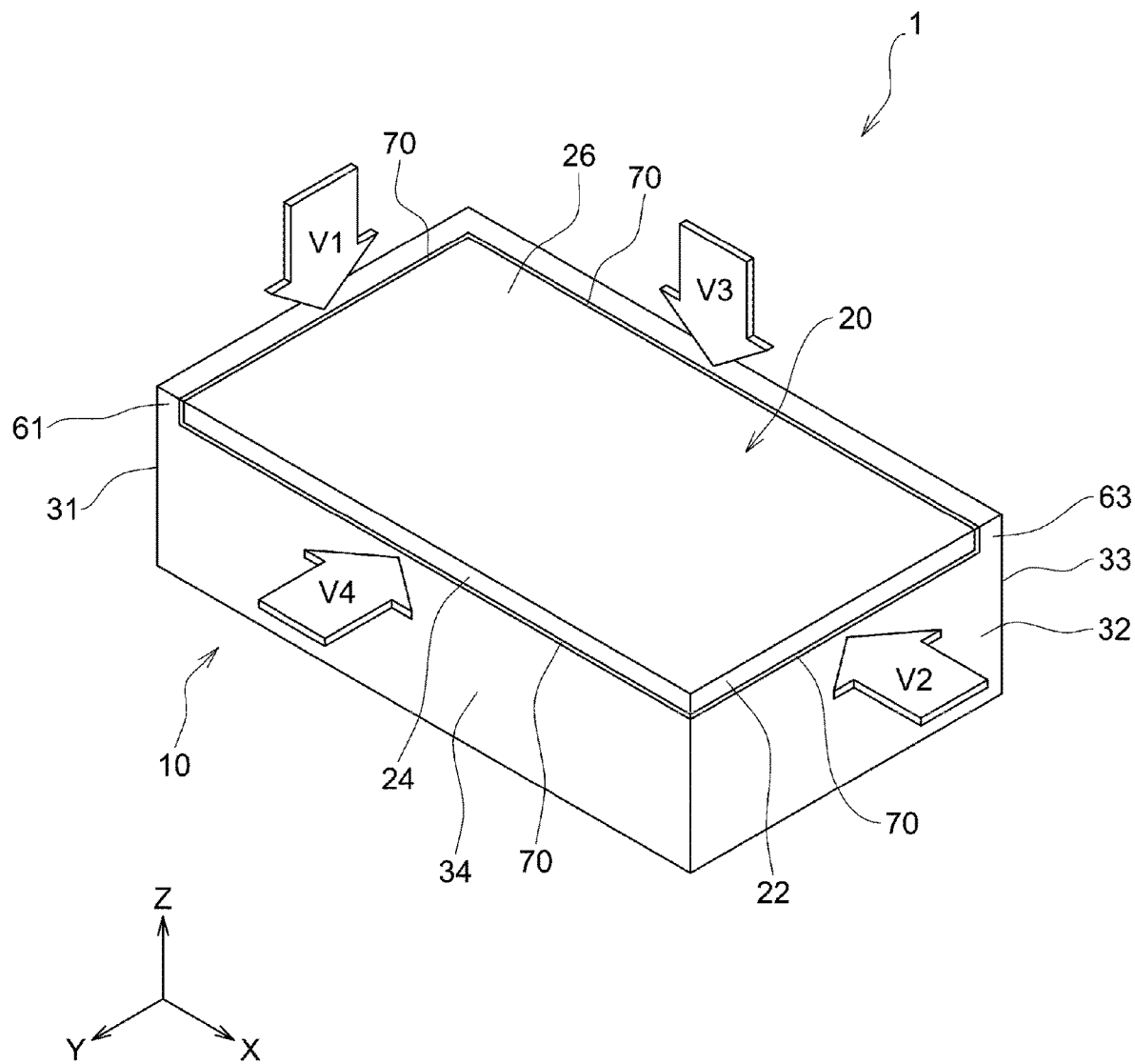
FIG. 5C is a perspective view explanatory of a process of assembling a laser module shown in FIG. 2.

Now a method of manufacturing a laser module 1 thus constructed will be described. First, the aforementioned housing 10 is prepared. The aforementioned optical components 40-46 are mounted on the base portion 12 of the housing 10. As shown in FIG. 5A, a resin 70 is applied onto a resin application area (shaded area in FIG. 5A), which includes the lateral counter surface 61A of the counter portion 61 of the sidewall 31, the lateral counter surface 63A of the counter portion 63 of the sidewall 33, the cover support surface 52 of the sidewall 32, and the cover support surface 54 of the sidewall 34. In this example, an ultraviolet curing resin is used as the resin 70. In FIGS. 5A-5C, components other than the housing 10 and the cover member 20 are omitted from illustration for better understanding.

Next, the aforementioned cover member 20 is prepared. The opposing surface 25 of the cover member 20 (see FIG. 3) is opposed to the base portion 12 of the housing 10 (the state illustrated in FIG. 4). In this state, as shown in FIG. 5B, the cover member 20 is placed so as to face the lateral counter surface 61A of the counter portion 61 of the sidewall 31 (P1) and is also placed so as to face the lateral counter surface 63A of the counter portion 63 of the sidewall 33 (P2). Thus, the lateral cover surface 21 of the cover member 20 is brought into contact with the resin 70 applied onto the lateral counter surface 61A, and the lateral cover surface 23 of the cover member 20 is brought into contact with the resin 70 applied onto the lateral counter surface 63A. Furthermore, the cover member 20 is pushed toward the cover support surface 52 of the sidewall 32 (P3) and is also pushed toward the cover support surface 54 of the sidewall 34 (P4). Thus, the opposing surface 25 of the cover member 20 is brought into contact with the resin 70 applied onto the cover support surfaces 52 and 54 of the sidewalls 32 and 34.

At that time, the cover member 20 can be positioned in the X-direction by placing the cover member 20 so as to face the lateral counter surface 61A of the counter portion 61 of the sidewall 31. The cover member 20 can be positioned in the Y-direction by placing the cover member 20 so as to face the lateral counter surface 63A of the counter portion 63 of the sidewall 33. Thus, according to one or more embodiments, the cover member 20 can be positioned with accuracy on the XY-plane.

In this state, as shown in FIG. 5C, ultraviolet rays are irradiated to the resin 70 in all possible directions with use of an ultraviolet irradiation apparatus (UV furnace) or the like. At that time, the resin 70 located between the sidewall 31 and the cover member 20 is exposed to the outside on the +Z side while it extends along the YZ-plane. Therefore, the resin 70 located between the sidewall 31 and the cover member 20 can be cured by ultraviolet rays (V1) irradiated along the YZ-plane. Furthermore, the resin 70 located between the sidewall 32 and the cover member 20 is exposed to the outside on the +X side while it extends along the XY-plane. Therefore, the resin 70 located between the sidewall 32 and the cover member 20 can be cured by ultraviolet rays (V2) irradiated along the XY-plane. Moreover, the resin 70 located between the sidewall 33 and the cover member 20 is exposed to the outside on the +Z side while it extends along the XZ-plane. Therefore, the resin 70 located between the sidewall 33 and the cover member 20 can be cured by ultraviolet rays (V3) irradiated along the XZ-plane. Furthermore, the resin 70 located between the sidewall 34 and the cover member 20 is exposed to the outside on the +Y side while it extends along the XY-plane. Therefore, the resin 70 located between the sidewall 34 and the cover member 20 can be cured by ultraviolet rays (V4) irradiated along the XY-plane.

Thus, according to one or more embodiments, the resin 70 located between the sidewalls 31-34 and the cover member 20 is arranged so as to extend along a plane toward an inside of the housing 10 from a portion where it is exposed to the outside. Therefore, by irradiation along the plane from the outside, ultraviolet rays can be introduced into the interior of the resin 70. Accordingly, an ultraviolet curable resin, which can achieve short-time curing, can be used as the resin 70. Thus, a throughput for manufacturing the laser module 1 can be improved. In the structure of the conventional example shown in FIG. 1, no ultraviolet rays can be irradiated to the resin 930 located near the accommodation space S from the outside. Therefore, an ultraviolet curable resin cannot be used as the resin 930.

Figure 6:
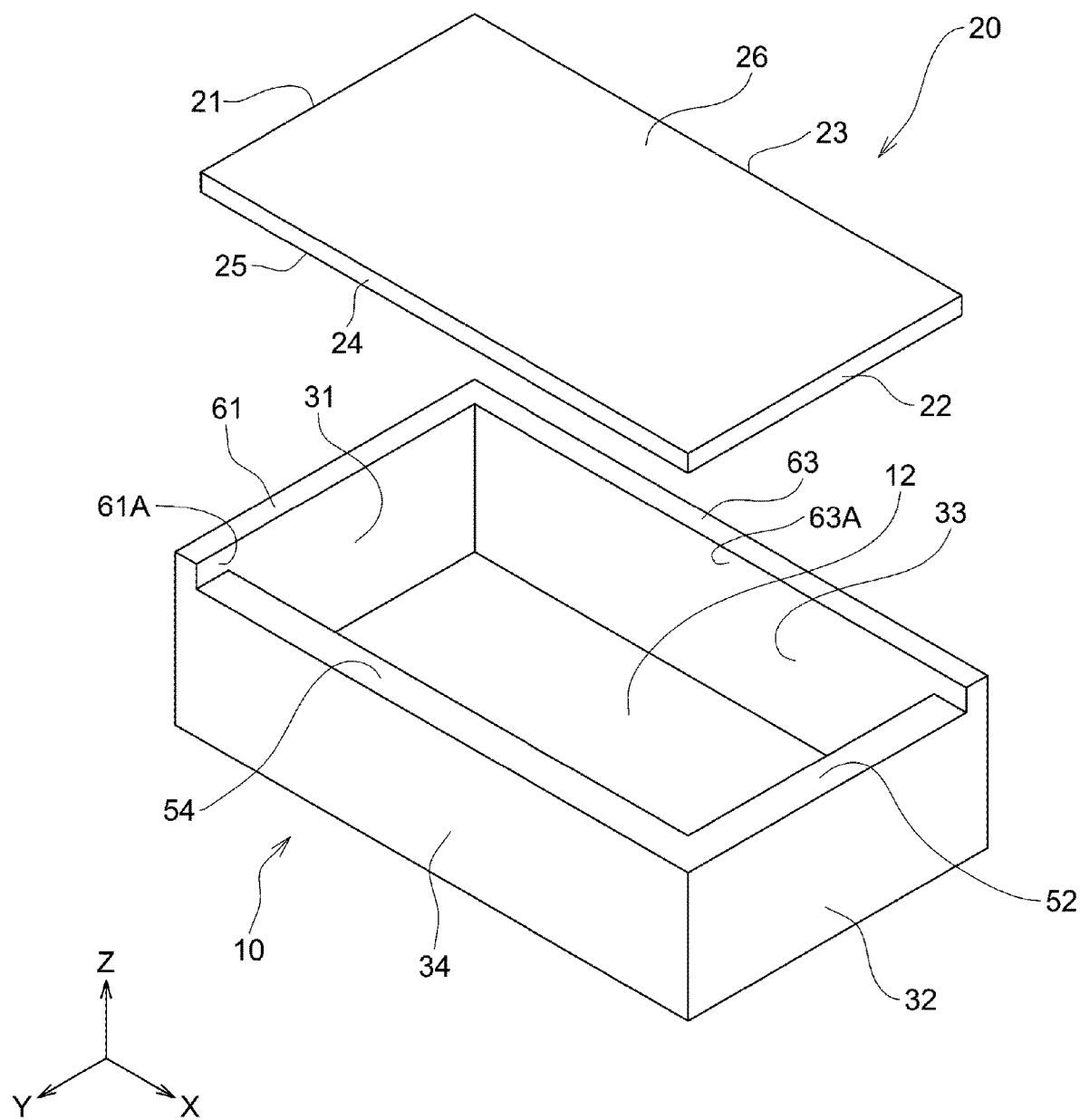
FIG. 6 is an exploded perspective view of a portion of a laser module according to one or more embodiments of the present invention.

According to one or more embodiments, the sidewall 31 includes the counter portion 61 and the cover support surface 51, and the sidewall 33 includes the counter portion 63 and the cover support surface 53. For example, as shown in FIG. 6, the cover support surface 51 of the sidewall 31 may be omitted so that the sidewall 31 only includes the counter portion 61. Similarly, the cover support surface 53 of the sidewall 33 may be omitted so that the sidewall 33 only includes the counter portion 63.

Figure 7:
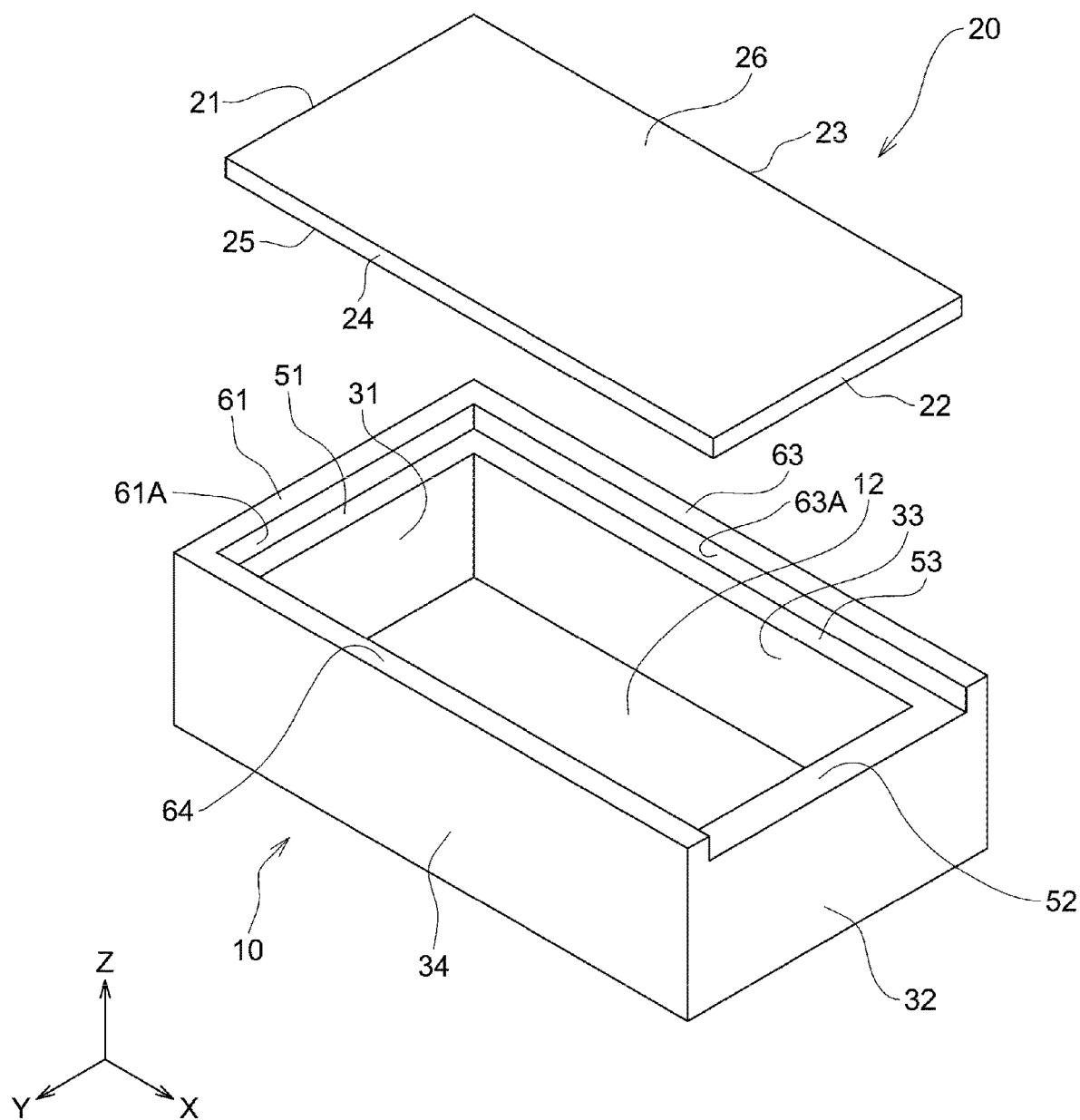
FIG. 7 is an exploded perspective view of a portion of a laser module according to one or more embodiments of the present invention.

According to one or more embodiments, the aforementioned advantageous effects of preventing deformation of the housing 10 can be attained on any cross-sections of the housing 10 and the cover member 20 that are parallel to the XZ-plane and also on any cross-sections of the housing 10 and the cover member 20 that are parallel to the YZ-plane. As shown in FIG. 7, however, a counter portion 64 may also be formed on the sidewall 34 so that the aforementioned advantageous effects of preventing deformation of the housing 10 is attained only on cross-sections of the housing 10 and the cover member 20 that are parallel to the XZ-plane. In this case, the resin 70 is provided on only one side of the cover member 20 in the X-direction (on the side of the lateral cover surface 21) while the opposite lateral cover surface 22 is exposed to the outside. Therefore, the resin 70 located between the lateral counter surface 61A of the counter portion 61 of the sidewall 31 and the lateral cover surface 21 of the cover member 20 can deform in the X-direction without any restriction, so that the aforementioned advantageous effects of preventing deformation of the housing 10 can be attained.

Figure 8:
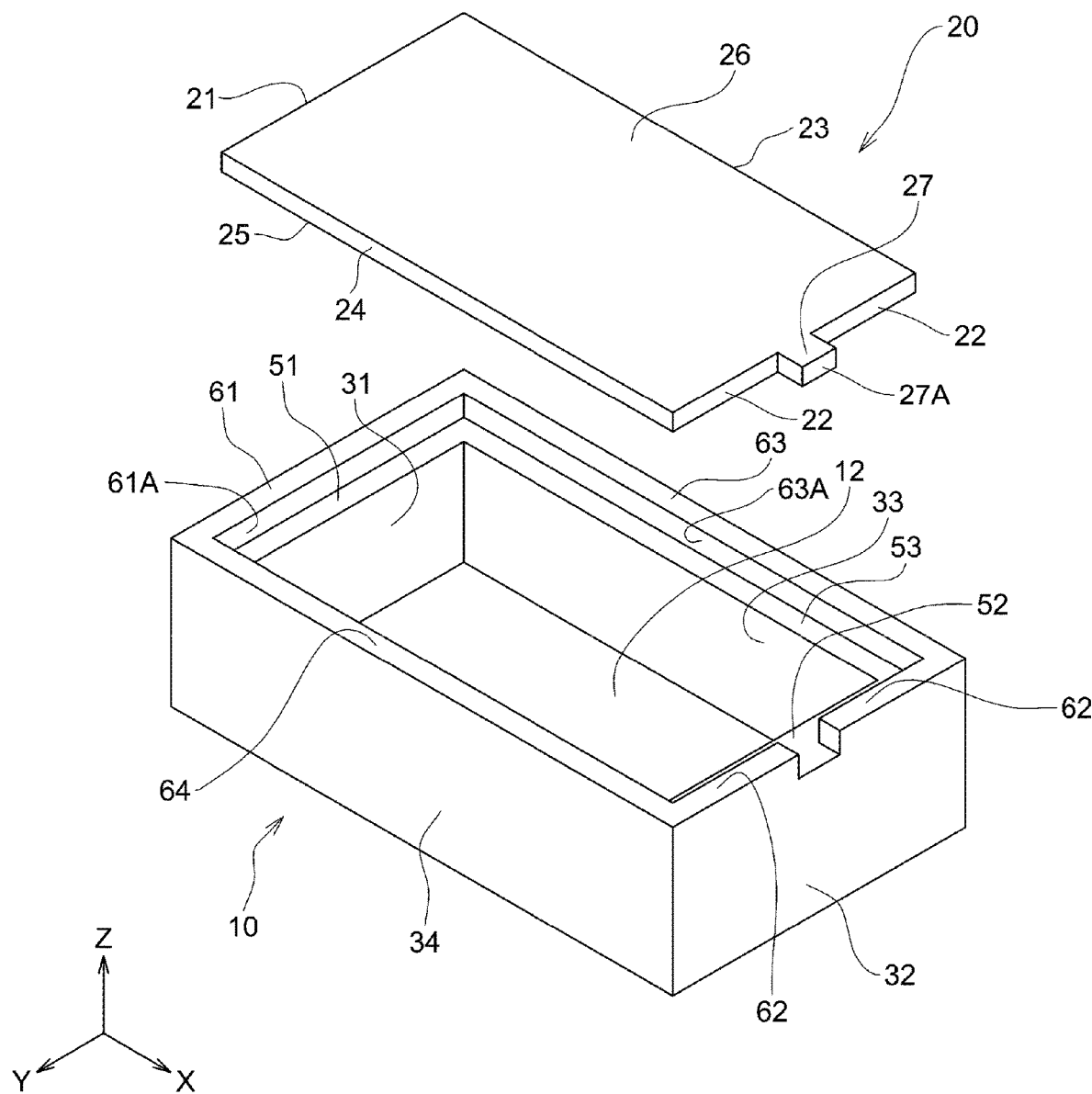
FIG. 8 is an exploded perspective view of a portion of a laser module according to one or more embodiments of the present invention.

Additionally, as shown in FIG. 8, a counter portion 62 may also be formed on a portion of the sidewall 32, for example, so that the aforementioned advantageous effects of preventing deformation of the housing 10 can be attained on only part of cross-sections of the housing 10 and the cover member 20 that are parallel to the XZ-plane. In the example illustrated in FIG. 8, a protrusion 27 is formed on the cover member 20 so as to correspond to a portion where the counter portion 62 is not formed. A lateral cover surface 27A of the protrusion 27 is exposed to the outside. Therefore, with regard to cross-sections of the housing 10 and the cover member 20 that are parallel to the XZ-plane and pass through the protrusion 27, the resin 70 is provided on only one side of the cover member 20 in the X-direction (on the side of the lateral cover surface 21) while the opposite lateral cover surface 27A is exposed to the outside. Therefore, the resin 70 located between the lateral counter surface 61A of the counter portion 61 of the sidewall 31 and the lateral cover surface 21 of the cover member 20 can deform in the X-direction without any restriction, so that the aforementioned advantageous effects of preventing deformation of the housing 10 can be attained. Thus, the housing 10 and the cover member 20 can be configured such that the aforementioned advantageous effects of preventing deformation of the housing 10 can be attained on at least one cross-section that is parallel to the Z-direction.

Figure 9:
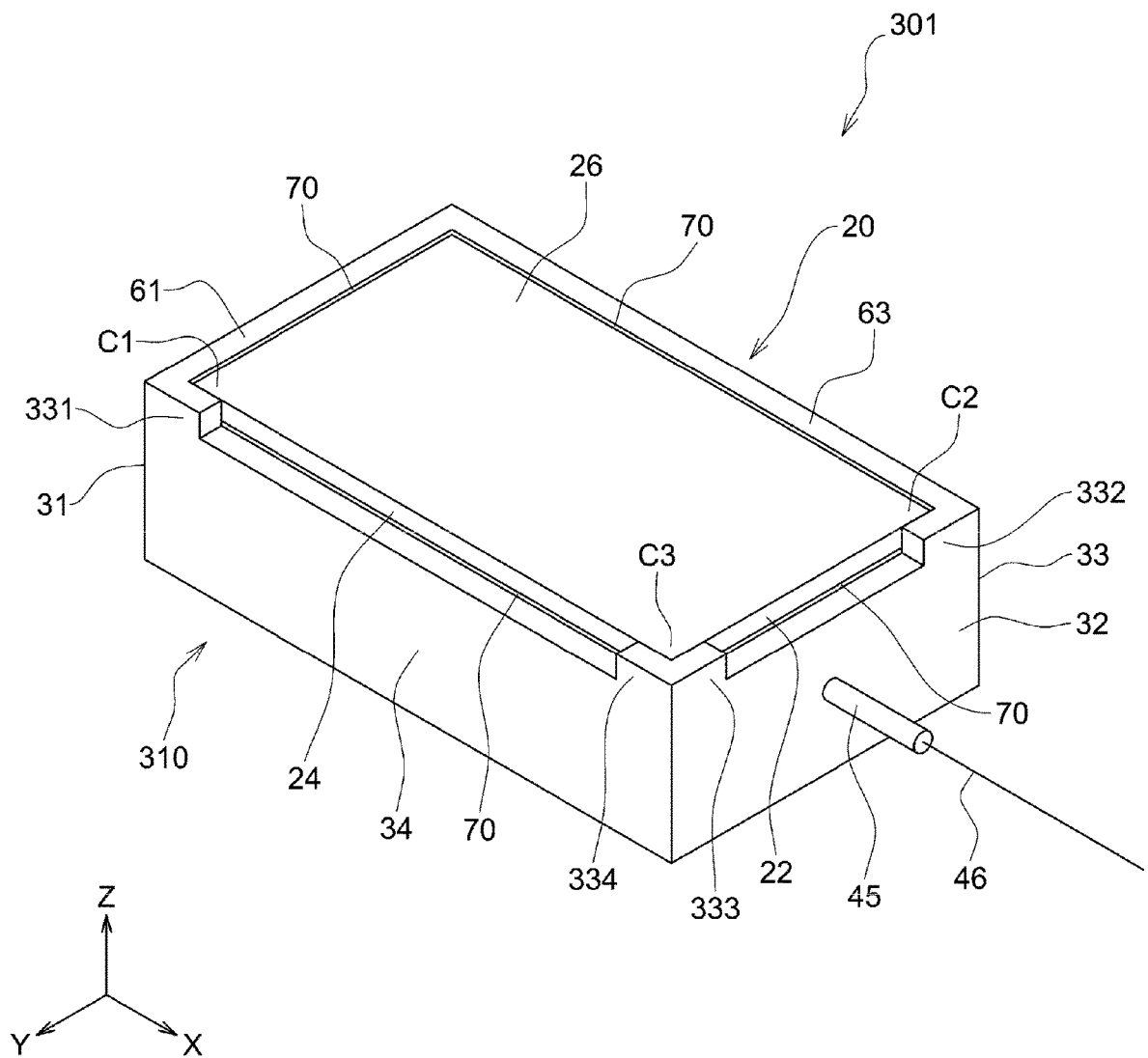
FIG. 9 is a perspective view showing a laser module according to one or more embodiments of the present invention.
Figure 10:
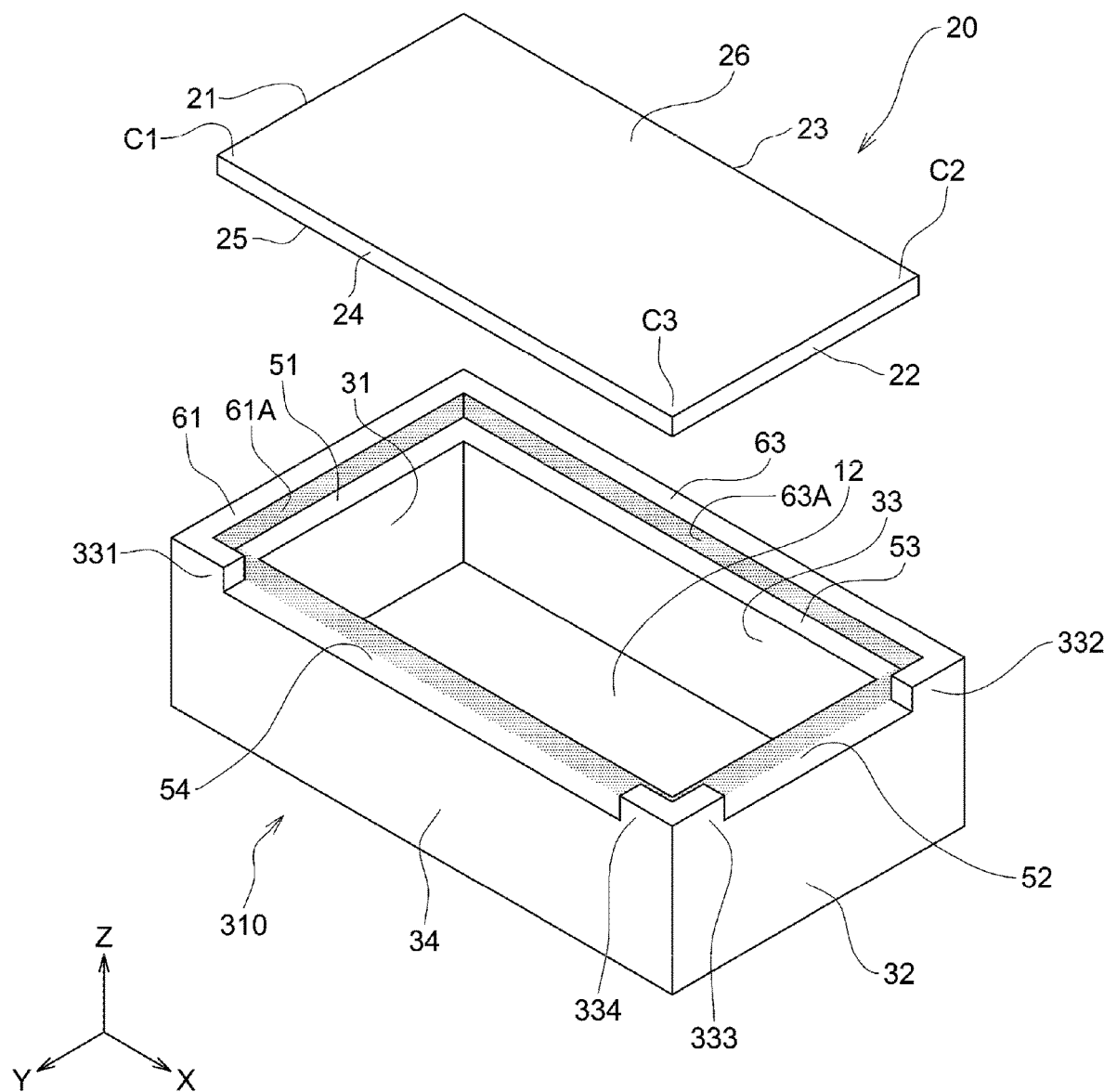
FIG. 10 is an exploded perspective view of a portion of the laser module shown in FIG. 9.

FIG. 9 is a perspective view showing a laser module 301 according to one or more embodiments of the present invention, and FIG. 10 is a perspective view of the laser module 301 when the laser module 301 is disassembled. In FIG. 10, components of the laser module 301 other than the housing 310 and the cover member 20 are omitted from illustration for better understanding.

The housing 310 of the laser module 301 includes a counter corner portion 331 extending along the +X-direction from an end of the counter portion 61 on the +Y side, a counter corner portion 332 extending along the +Y-direction from an end of the counter portion 63 on the +X side, a counter corner portion 333 extending along the −Y-direction from a connected portion of the sidewall 32 and the sidewall 34, and a counter corner portion 334 extending along the −X-direction from the connected portion of the sidewall 32 and the sidewall 34. The counter corner portion 331 and the counter corner portion 334 project from the cover support surface 54 in the +Z-direction. The counter corner portion 332 and the counter corner portion 333 project from the cover support surface 52 in the +Z-direction.

The counter corner portion 331 is configured to face the lateral cover surface 24 of a corner portion C1 of the cover member 20. The counter corner portion 332 is configured to face the lateral cover surface 22 of a corner portion C2 of the cover member 20. Furthermore, the counter corner portion 333 is configured to face the lateral cover surface 22 of a corner portion C3 of the cover member 20. The counter corner portion 334 is configured to face the lateral cover surface 24 of the corner portion C3 of the cover member 20. In other words, according to one or more embodiments, the counter corner portions 331-334 are provided so as to face all of the corner portions C1-C4 of the cover member 20.

When the cover member 20 is placed on the cover support surfaces 51-54 with those counter corner portions 331-334, the corner portion C1 of the cover member 20 is positioned by the counter corner portion 331, the corner portion C2 is positioned by the counter corner portion 332, and the corner portion C3 is positioned by the counter corner portions 333 and 334. Thus, provision of the counter corner portions 331-334 allows the cover member 20 to be positioned more accurately on the XY-plane. Particularly, in the present embodiments, the counter corner portions 331-334 are provided so as to face all of the corner portions C1-C4 of the cover member 20. Therefore, the position of the cover member 20 is stably maintained. In this example, the resin 70 is applied to a shaded area in FIG. 10 to fix the cover member 20 onto the housing 310.

In the aforementioned embodiments, the counter portion 61 of the sidewall 31 does not need to be formed over the overall length of the sidewall 31 in the Y-direction. The counter portion 63 of the sidewall 33 does not need to be formed over the overall length of the sidewall 33 in the X-direction. Such examples will be described in one or more embodiments.

Figure 11:
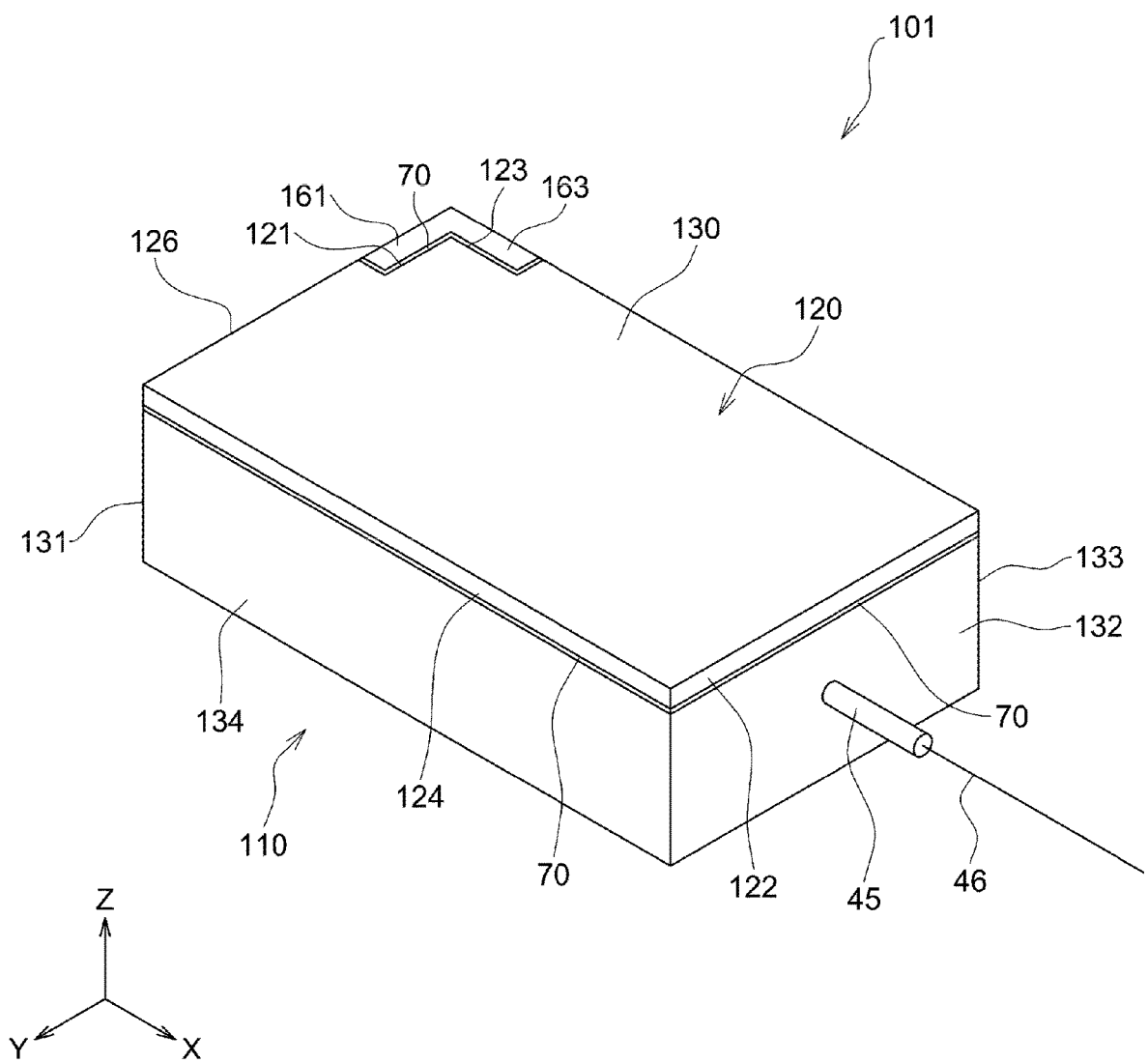
FIG. 11 is a perspective view showing a laser module according to one or more embodiments of the present invention.
Figure 12:
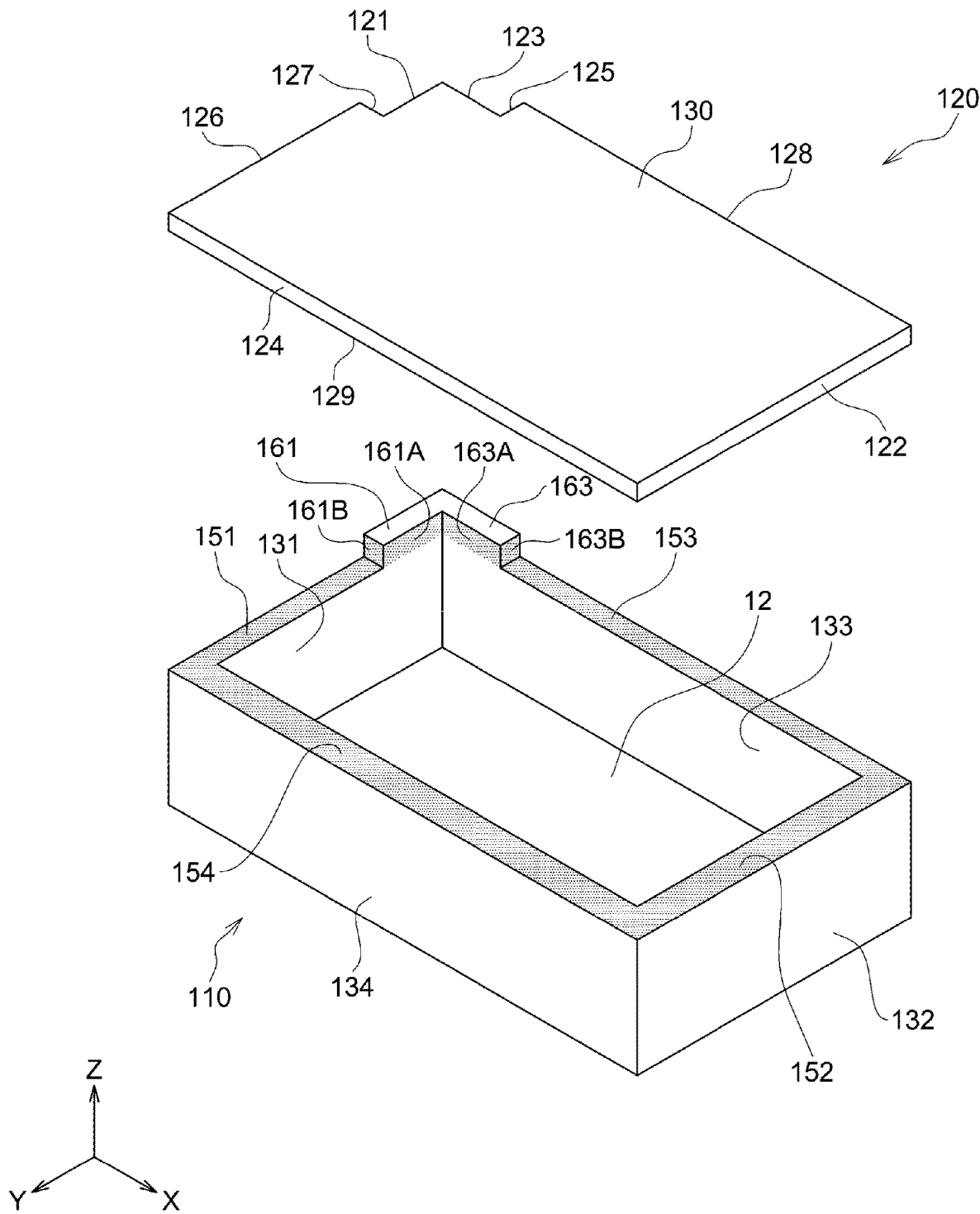
FIG. 12 is an exploded perspective view of a portion of the laser module shown in FIG. 11.

FIG. 11 is a perspective view showing a laser module 101 according to one or more embodiments of the present invention, and the FIG. 12 is a perspective view of the laser module 101 when the laser module 101 is disassembled. In FIG. 12, components other than a housing 110 and a cover member 120 of the laser module 101 are omitted from illustration for better understanding.

The laser module 101 includes a housing 110 in the form of a generally rectangular parallelepiped, which is opened in the +Z-direction, and a cover member 120 in the form of a generally flat plate. The housing 110 includes sidewalls 131-134 extending from the base portion 12 in the Z-direction (height direction) so as to surround the base portion 12. The sidewall 131 (first sidewall) has a cover support surface 151 for supporting the cover member 120 and a counter portion 161 extending in the +Z-direction from the −Y side of the cover support surface 151. The counter portion 161 has a lateral counter surface 161A extending in the +Z-direction and in parallel to the YZ-plane and a lateral counter surface 161B extending in the +Z-direction from the cover support surface 151 and in parallel to the XZ-plane. The sidewall 132 (second sidewall) has a cover support surface 152 on its top for supporting the cover member 120. The sidewall 133 (third sidewall) has a cover support surface 153 for supporting the cover member 120 and a counter portion 163 extending in the +Z-direction on the −X side of the cover support surface 153. The counter portion 163 has a lateral counter surface 163A extending in the +Z-direction and in parallel to the XZ-plane and a lateral counter surface 163B extending in the +Z-direction from the cover support surface 153 and in parallel to the YZ-plane. The sidewall 134 (fourth sidewall) has a cover support surface 154 on its top for supporting the cover member 120.

The counter portion 161 of the sidewall 131 and the counter portion 163 of the sidewall 133 intersect each other at a connected portion of the sidewall 131 and the sidewall 133. The counter portion 161 of the sidewall 131 extends in the +Y-direction from the connected portion of the sidewall 131 and the sidewall 133 by a predetermined distance. The counter portion 163 of the sidewall 133 extends in the +X-direction from the connected portion of the sidewall 131 and the sidewall 133 by a predetermined distance.

As shown in FIG. 12, the cover member 120 includes eight lateral cover surfaces 121-128 extending in the Z-direction, an opposing surface 129 opposed to the base portion 12 of the housing 110 in the Z-direction, and a front surface 130 located on an opposite side of the opposing surface 129 in the Z-direction. The lateral cover surface 121 (first lateral cover surface) and the lateral cover surface 122 (second lateral cover surface) are in parallel to the YZ-plane and are located opposite to each other in the X-direction. The lateral cover surface 123 (third lateral cover surface) and the lateral cover surface 124 (fourth lateral cover surface) are in parallel to the XZ-plane and are located opposite to each other in the Y-direction. The lateral cover surfaces 125 and 126 are in parallel to the YZ-plane and are located on an opposite side of the lateral cover surface 122 in the X-direction. Furthermore, the lateral cover surfaces 127 and 128 are in parallel to the XZ-plane and located on an opposite side of the lateral cover surface 124 in the Y-direction. Thus, the cover member 120 according to one or more embodiments has a shape in which an L-shaped portion that corresponds to the counter portions 161 and 163 of the housing 110 has been removed from a rectangular plate member.

As shown in FIG. 11, a resin 70 is disposed between the sidewalls 131-134 of the housing 110 and the cover member 120 over the whole circumference of the housing 110. More specifically, the resin 70 is provided continuously between a lateral counter surface 161A of the counter portion 161 of the sidewall 131 and the lateral cover surface 121 of the cover member 120, between a lateral counter surface 163A of the counter portion 163 of the sidewall 133 and the lateral cover surface 123 of the cover member 120, between a lateral counter surface 163B of the counter portion 163 of the sidewall 133 and the lateral cover surface 125 of the cover member 120, between the cover support surface 153 of the sidewall 133 and the opposing surface 129 of the cover member 120, between the cover support surface 152 of the sidewall 132 and the opposing surface 129 of the cover member 120, between the cover support surface 154 of the sidewall 134 and the opposing surface 129 of the cover member 120, between the cover support surface 151 of the sidewall 131 and the opposing surface 129 of the cover member 120, and between a lateral counter surface 161B of the counter portion 161 of the sidewall 131 and the lateral cover surface 127 of the cover member 120. Thus, the resin 70 is disposed between the sidewalls 131-134 of the housing 110 and the cover member 120 over the whole circumference of the housing 110. Accordingly, the resin 70 allows the accommodation space S in the laser module 101 to be sealed for moisture prevention.

With regard to cross-sections that are parallel to the XZ-plane and pass through the counter portion 161 of the sidewall 131, the lateral counter surface 161A of the counter portion 161 of the sidewall 131 and the lateral cover surface 121 of the cover member 120 are opposed to each other while the resin 70 is interposed therebetween. The cover support surface 152 of the sidewall 132 and the opposing surface 129 of the cover member 120 are opposed to each other while the resin 70 is interposed therebetween. The lateral cover surface 122 of the cover member 120, which is located on an opposite side of the lateral cover surface 121, is exposed to an outside. In other words, the resin 70 is provided only on one side of the cover member 120 (on the lateral cover surface 121) in the X-direction, and the lateral cover surface 122, which is on an opposite side of the lateral cover surface 121, is exposed to the outside. Therefore, the resin 70 located between the lateral counter surface 161A of the counter portion 161 of the sidewall 131 and the lateral cover surface 121 of the cover member 120 can deform without any restriction in the X-direction. Accordingly, when the resin 70 located between the lateral counter surface 161A of the counter portion 161 of the sidewall 131 and the lateral cover surface 121 of the cover member 120 expands or shrinks in the X-direction, deformation of the resin 70 exerts less influence on the housing 110. Thus, the housing 110 is prevented from deforming. As a result, the optical characteristics of the optical components placed in the accommodation space S within the housing 110 are prevented from being deteriorated. Such advantageous effects can be attained in the same manner with regard to cross-sections that are parallel to the YZ-plane and pass through the counter portion 163 of the sidewall 133.

When a laser module 101 thus constructed is manufactured, a resin 70 is applied onto a resin application area shaded in FIG. 12 (the cover support surface 151 of the sidewall 131, the lateral counter surfaces 161A and 161B of the counter portion 161 of the sidewall 131, the lateral counter surfaces 163A and 163B of the counter portion 163 of the sidewall 133, the cover support surface 153 of the sidewall 133, the cover support surface 152 of the sidewall 132, and the cover support surface 154 of the sidewall 134).

As with the above-described embodiments, an ultraviolet curable resin can be used for the resin 70.

In a state in which the opposing surface 129 of the cover member 120 is opposed to the base portion 12 of the housing 110, the cover member 120 is placed so as to face the lateral counter surface 161A of the counter portion 161 of the sidewall 131 and the lateral counter surface 163B of the counter portion 163 of the sidewall 133. The cover member 120 is also placed so as to face the lateral counter surface 163A of the counter portion 163 of the sidewall 133 and the lateral counter surface 161B of the counter portion 161 of the sidewall 131. Thus, the lateral cover surfaces 121, 125, 123, and 127 of the cover member 120 are brought into contact with the resin 70 applied onto the lateral counter surfaces 161A, 163B, 163A, and 161B, respectively. Furthermore, the cover member 120 is pushed toward the cover support surfaces 151-154 of the sidewalls 131-134. Thus, the opposing surface 129 of the cover member 120 is brought into contact with the resin 70 applied onto the cover support surfaces 151-154 of the sidewalls 131-134.

At that time, the cover member 120 can be positioned in the X-direction by placing the cover member 120 so as to face the lateral counter surface 161A of the counter portion 161 of the sidewall 131 and the lateral counter surface 163B of the counter portion 163 of the sidewall 133. The cover member 120 can be positioned in the Y-direction by placing the cover member 120 so as to face the lateral counter surface 163A of the counter portion 163 of the sidewall 133 and the lateral counter surface 161B of the counter portion 161 of the sidewall 131. Thus, according to one or more embodiments, the cover member 120 can be positioned with accuracy on the XY-plane.

In this state, ultraviolet rays are irradiated to the resin 70 in all possible directions with use of an ultraviolet irradiation apparatus (UV furnace) or the like. At that time, the resin 70 located between the sidewalls 131-134 and the cover member 120 extends from an externally exposed portion along the YZ-plane, the XZ-plane, or the XY-plane. Therefore, the resin 70 located between the sidewalls 131-134 and the cover member 120 can be cured by ultraviolet rays irradiated along the YZ-plane, the XZ-plane, or the XY-plane. Therefore, all of the resin 70 located between the sidewalls 131-134 and the cover member 120 can be cured by ultraviolet rays irradiated from the outside.

Figure 13:
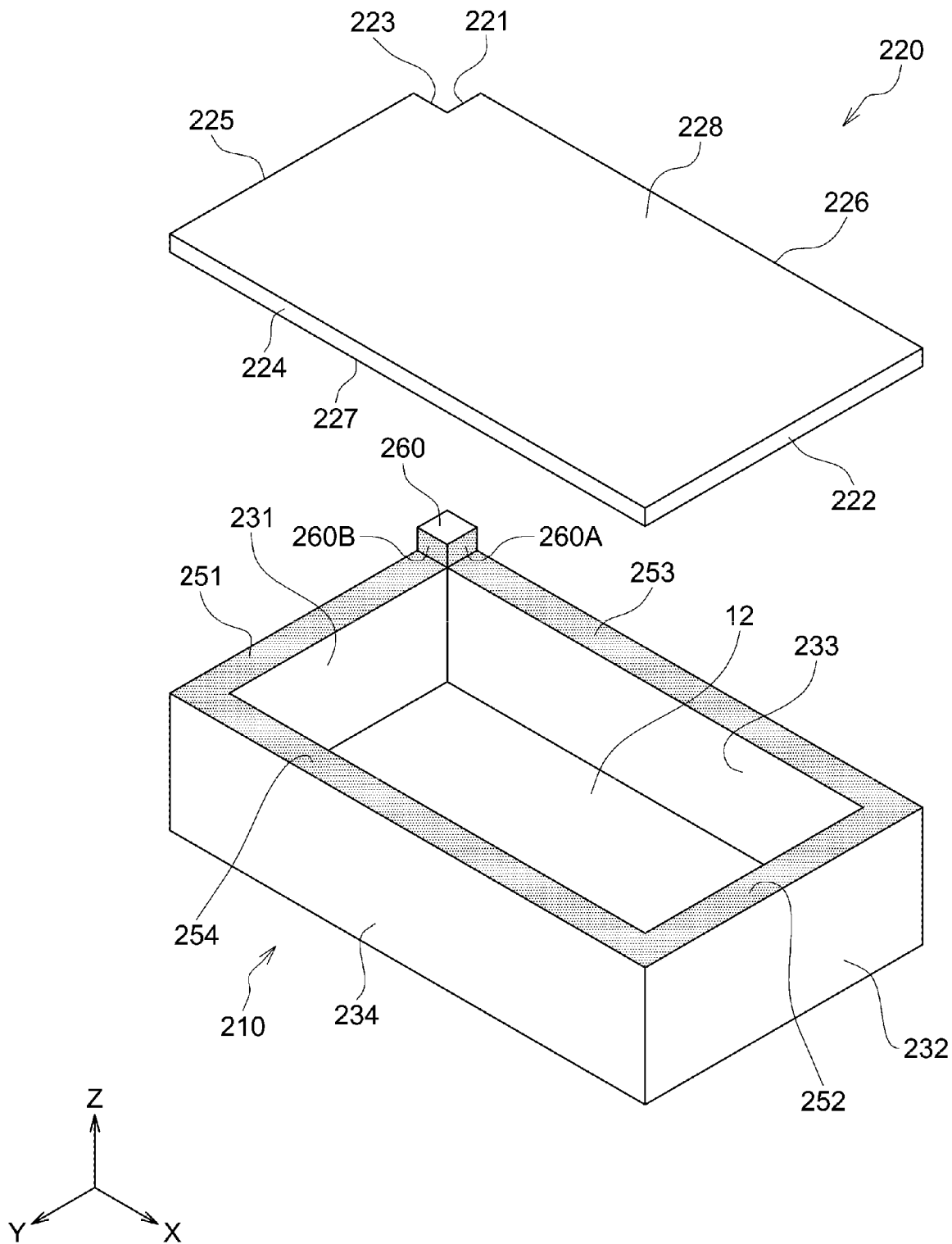
FIG. 13 is an exploded perspective view of a laser module according to one or more embodiments of the present invention.

FIG. 13 is a perspective view of a laser module according to one or more embodiments of the present invention when the laser module is disassembled. In FIG. 13, components other than a housing 210 and a cover member 220 of the laser module are omitted from illustration for better understanding. The present embodiments correspond to those in which the length of the counter portion 161 of the sidewall 131 along the Y-direction and the length of the counter portion 163 of the sidewall 133 along the X-direction have been shortened from the those in the embodiments described above.

The laser module includes a housing 210 in the form of a generally rectangular parallelepiped, which is opened in the +Z-direction, and a cover member 220 in the form of a generally flat plate. The housing 210 includes sidewalls 231-234 extending from the base portion 12 in the Z-direction (height direction) so as to surround the base portion 12. The sidewalls 231-234 have cover support surfaces 251-254 for supporting the cover member 220, respectively. According to one or more embodiments, a counter portion 260 extending in the +Z-direction is provided at a connected portion of the sidewall 231 and the sidewall 233, which are located adjacent to each other. The counter portion 260 is shared between the sidewall 231 and the sidewall 233. The counter portion 260 has a lateral counter surface 260A extending the +Z-direction from the cover support surface 253 and in parallel to the YZ-plane and a lateral counter surface 260B extending in +Z-direction from the cover support surface 251 and in parallel to the XZ-plane.

The cover member 220 includes six lateral cover surfaces 221-226 extending in the Z-direction, an opposing surface 227 opposed to the base portion 12 of the housing 210 in the Z-direction, and a front surface 228 located on an opposite side of the opposing surface 227 in the Z-direction. The lateral cover surface 221 and the lateral cover surface 222 are in parallel to the YZ-plane and are located opposite to each other in the X-direction. The lateral cover surface 223 and the lateral cover surface 224 are in parallel to the XZ-plane and are located opposite to each other in the Y-direction. The lateral cover surface 225 is in parallel to the YZ-plane and is located opposite to the lateral cover surface 222 in the X-direction. The lateral cover surface 226 is in parallel to the XZ-plane and is located opposite to the lateral cover surface 224 in the Y-direction. Thus, the cover member 220 according to one or more embodiments has a shape in which a rectangular portion that corresponds to the counter portion 260 of the housing 210 has been removed from a rectangular plate member.

According to one or more embodiments, a resin 70 is disposed between the sidewalls 231-234 of the housing 210 and the cover member 220 over the whole circumference of the housing 210. More specifically, the resin 70 is provided continuously between the lateral counter surface 260A of the counter portion 260 and the lateral cover surface 221 of the cover member 220, between the cover support surface 253 of the sidewall 233 and the opposing surface 227 of the cover member 220, between the cover support surface 252 of the sidewall 232 and the opposing surface 227 of the cover member 220, between the cover support surface 254 of the sidewall 234 and the opposing surface 227 of the cover member 220, between the cover support surface 251 of the sidewall 231 and the opposing surface 227 of the cover member 220, and the lateral counter surface 260B of the counter portion 260 and the lateral cover surface 223 of the cover member 220. Thus, the resin 70 is disposed between the sidewalls 231-234 of the housing 210 and the cover member 220 over the whole circumference of the housing 210. Accordingly, the resin 70 allows the accommodation space S in the laser module to be sealed for moisture prevention.

With regard to cross-sections that are parallel to the XZ-plane and pass through the counter portion 260, the lateral counter surface 260A of the counter portion 260 and the lateral cover surface 221 of the cover member 220 are opposed to each other while the resin 70 is interposed therebetween. The cover support surfaces 253 and 252 of the sidewalls 233 and 232 and the opposing surface 227 of the cover member 220 are opposed to each other while the resin 70 is interposed therebetween. The lateral cover surface 221 of the cover member 220 and the lateral cover surface 222, which is located on an opposite side of the lateral cover surface 221, are exposed to an outside. In other words, the resin 70 is provided only on one side of the cover member 220 (on the lateral cover surface 221) in the X-direction, and the lateral cover surface 222 on the opposite side is exposed to the outside. Therefore, the resin 70 located between the lateral counter surface 260A of the counter portion 260 and the lateral cover surface 221 of the cover member 220 can deform without any restriction in the X-direction. Accordingly, when the resin 70 located between the lateral counter surface 260A of the counter portion 260 and the lateral cover surface 221 of the cover member 220 expands or shrinks in the X-direction, deformation of the resin 70 exerts less influence on the housing 221. Thus, the housing 210 is prevented from deforming. As a result, the optical characteristics of the optical components placed in the accommodation space S within the housing 210 are prevented from being deteriorated. Such advantageous effects can be attained in the same manner with regard to cross-sections that are parallel to the YZ-plane and pass through the counter portion 260.

When a laser module thus constructed is manufactured, a resin 70 is applied onto a resin application area shaded in FIG. 13 (the cover support surface 251 of the sidewall 231, the lateral counter surfaces 260B and 260A of the counter portion 260, the cover support surface 253 of the sidewall 233, the cover support surface 252 of the sidewall 232, and the cover support surface 254 of the sidewall 234). As with the above-described embodiments, an ultraviolet curable resin can be used for the resin 70.

In a state in which the opposing surface 227 of the cover member 220 is opposed to the base portion 12 of the housing 210, the cover member 220 is placed so as to face the lateral counter surface 260A of the counter portion 260. The cover member 220 is placed so as to face the lateral counter surface 260B of the counter portion 260. Thus, the lateral cover surfaces 221 and 223 of the cover member 220 are brought into contact with the resin 70 applied onto the lateral counter surfaces 260A and 260B. Furthermore, the cover member 220 is pushed toward the cover support surfaces 251-254 of the sidewalls 231-234. Thus, the opposing surface 227 of the cover member 220 is brought into contact with the resin 70 applied onto the cover support surfaces 251-254 of the sidewalls 231-234.

At that time, the cover member 220 can be positioned in the X-direction by placing the cover member 220 so as to face the lateral counter surface 260A of the counter portion 260. The cover member 220 can be positioned in the Y-direction by placing the cover member 220 so as to face the lateral counter surface 260B of the counter portion 260. Thus, according to one or more embodiments, the cover member 220 can be positioned with accuracy on the XY-plane.

In this state, ultraviolet rays are irradiated to the resin 70 in all possible directions with use of an ultraviolet irradiation apparatus (UV furnace) or the like. At that time, the resin 70 located between the sidewalls 231-234 and the cover member 220 extends from an externally exposed portion along the YZ-plane, the XZ-plane, or the XY-plane. Therefore, the resin 70 located between the sidewalls 231-234 and the cover member 220 can be cured by ultraviolet rays irradiated along the YZ-plane, the XZ-plane, or the XY-plane. Therefore, all of the resin 70 located between the sidewalls 231-234 and the cover member 220 can be cured by ultraviolet rays irradiated from the outside.

Figure 14:
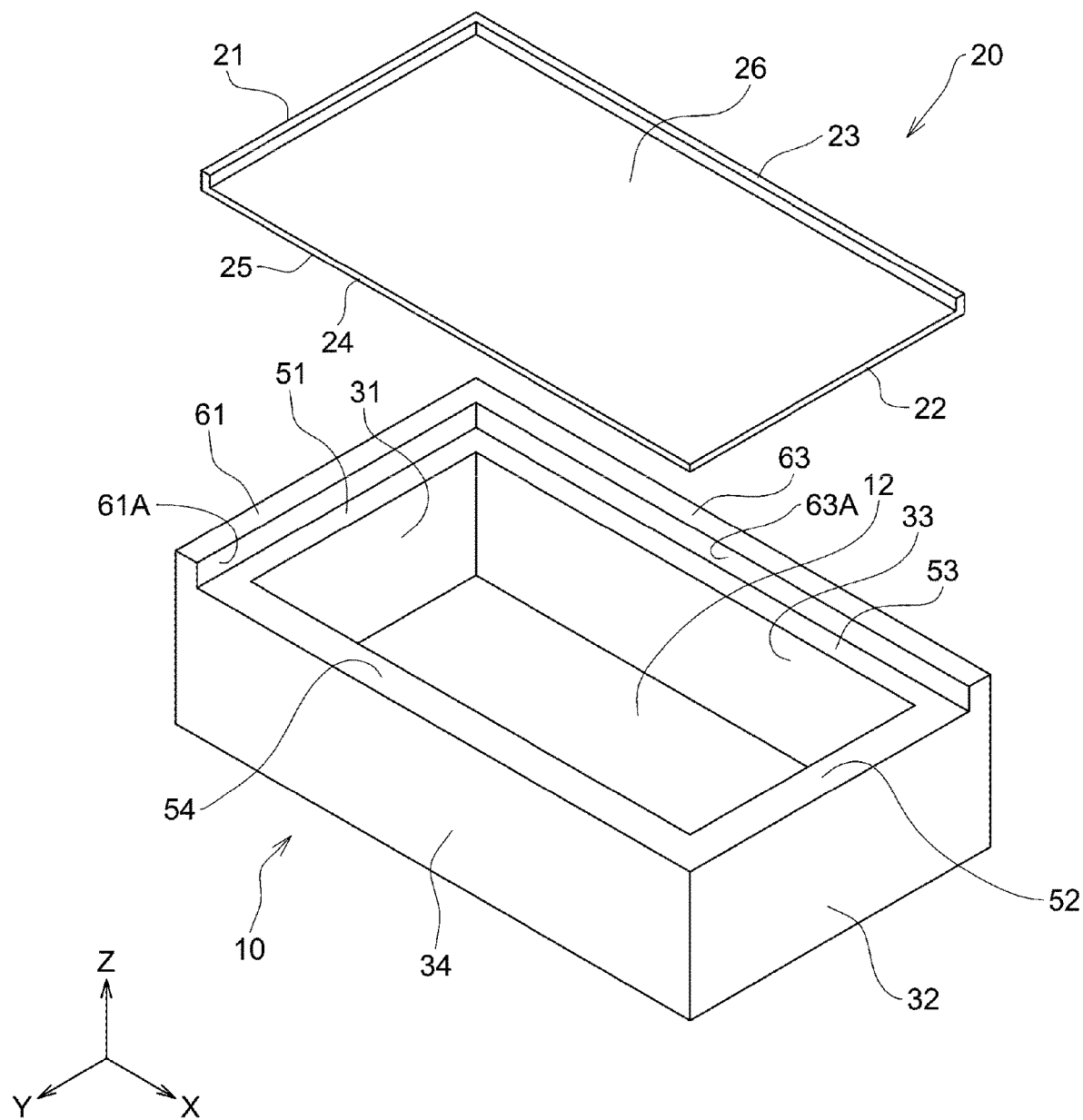
FIG. 14 is an exploded perspective view showing a variation of the laser module shown in FIG. 4.

According to one or more embodiments, the cover member 20 has a uniform thickness in the Z-direction. In order to reduce the weight of the laser module 1, however, the cover member 20 may be thinned in the Z-direction. For example, as shown in FIG. 14, the thickness of the lateral cover surface 22 of the cover member 20 may be made less than the thickness of the lateral cover surface 21 located on an opposite side of the lateral cover surface 22. Similarly, the thickness of the lateral cover surface 24 may be made less than the thickness of the lateral cover surface 23 located on an opposite side of the lateral cover surface 24. In the embodiments illustrated in FIGS. 6-14, the thickness of the lateral cover surfaces on which no resin 70 is applied may be made less than the lateral cover surface on the opposite side so as to reduce the weight of the laser module.

Each of the above embodiments illustrates an example in which the base portion and the sidewalls of the housing are integrally formed. However, the base portion and the sidewalls may be provided as separate members and assembled into the housing.

In the above embodiments, the resin 70 is formed between the sidewalls of the housing and the cover member over the whole circumference of the housing. However, the resin 70 does not need to seal between the sidewalls of the housing and the cover member over the whole circumference of the housing. Furthermore, the sidewall and the cover member may be fixed to each other with use of another fixation means and the resin 70.

In the aforementioned embodiments, two or more lateral counter surfaces are formed. However, only one lateral counter surface may be formed. In order to achieve accurate positioning on a plane, two or more lateral counter surfaces may be formed to position the cover member in two or more directions.

In the aforementioned embodiments, a laser module having a semiconductor laser device as an optical component has been described by way of example. Nevertheless, the present invention is not limited to such an example. For example, the present invention is also applicable to an optical transceiver module having a photodiode used as an optical component to receive and convert external light into electricity.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The present invention may be used for an optical module having a housing including an optical component mounted thereon.

REFERENCE SIGNS LIST

1 Laser module (optical module)
10 Housing
12 Base portion
20 Cover member
21 Lateral cover surface (first lateral cover surface)
22 Lateral cover surface (second lateral cover surface)
23 Lateral cover surface (third lateral cover surface)
24 Lateral cover surface (fourth lateral cover surface)
25 Opposing surface
31 Sidewall (first sidewall)
32 Sidewall (second sidewall)
33 Sidewall (third sidewall)
34 Sidewall (fourth sidewall)
40 Semiconductor laser device
41, 42 Lens
44 Ferrule fixation portion
45 Ferrule
46 Optical fiber
51-54 Cover support surface
61-64 Counter portion
61A, 63A Lateral counter surface
70 Resin
101 Laser module
110 Housing 120 Cover member
121-128 Lateral cover surface
129 Opposing surface
131-134 Sidewall
151-154 Cover support surface
161, 163 Counter portion
161A, 161B, 163A, 163B Lateral counter surface
210 Housing
220 Cover member
221-226 Lateral cover surface
227 Opposing surface
231-234 Sidewall
251-254 Cover support surface
260 Counter portion
260A, 260B Lateral counter surface
310 Housing
331-334 Counter corner portion
C1-C4 Corner portion
S Accommodation space

The invention claimed is:

1. An optical module comprising:
an optical component;
a base portion on which the optical component is mounted;
a housing that comprises sidewalls extending from the base portion in a height direction to surround the base portion;
a cover member that defines, along with the housing, an accommodation space in which the optical component is disposed; and
a resin for fixing the housing to the cover member, wherein
the cover member comprises:
an opposing surface that faces the base portion of the housing in the height direction;
a first lateral cover surface extending along the height direction; and
a second lateral cover surface extending along the height direction, wherein
the second lateral cover surface is disposed on an opposite side of the first lateral cover surface,
the sidewalls of the housing comprise:
a first sidewall comprising a first counter portion having a first lateral counter surface extending along the height direction; and
a second sidewall that faces the first sidewall, wherein
the second sidewall comprises a first cover support surface that supports the cover member, and
in at least one cross-section of the optical module on a plane parallel to both the height direction and a first direction perpendicular to the height direction:
the first lateral counter surface of the first sidewall of the housing faces the first lateral cover surface of the cover member while the resin is interposed therebetween,
the second lateral cover surface of the cover member is exposed to an outside of the optical module, and
the first cover support surface of the second sidewall of the housing faces the opposing surface of the cover member.

2. The optical module according to claim 1, wherein the first lateral counter surface of the first sidewall of the housing faces the first lateral cover surface of the cover member over an overall length of the first lateral counter surface while the resin is interposed therebetween, and the second lateral cover surface of the cover member is exposed to an outside of the optical module over an overall length of the second lateral cover surface.

3. The optical module according to claim 1, wherein the housing further comprises a counter corner that faces at least one corner of the cover member.

4. The optical module according to claim 1, wherein a thickness of the second lateral cover surface along the height direction is less than a thickness of the first lateral cover surface along the height direction.

5. The optical module according to claim 1, wherein the resin comprises an ultraviolet curable resin.

6. The optical module according to claim 1, wherein the cover member further comprises:
a third lateral cover surface extending along the height direction; and
a fourth lateral cover surface extending along the height direction, wherein
the fourth lateral cover surface is disposed on an opposite side of the third lateral cover surface,
the sidewalls of the housing further comprise:
a third sidewall comprising a second counter portion having a second lateral counter surface extending along the height direction; and
a fourth sidewall that faces the third sidewall, wherein
the fourth sidewall comprises a second cover support surface that supports the cover member, and
in at least one cross-section of the optical module on a plane parallel to both the height direction and a second direction perpendicular to the height direction:
the second lateral counter surface of the third sidewall of the housing faces the third lateral cover surface of the cover member while the resin is interposed therebetween,
the fourth lateral cover surface of the cover member is exposed to the outside of the optical module, and
the second cover support surface of the fourth sidewall of the housing faces the opposing surface of the cover member.

7. The optical module according to claim 6, wherein the second lateral counter surface of the third sidewall of the housing faces the third lateral cover surface of the cover member over an overall length of the second lateral counter surface while the resin is interposed therebetween, and the fourth lateral cover surface of the cover member is exposed to an outside of the optical module over an overall length of the fourth lateral cover surface.

8. The optical module according to claim 6, wherein the first sidewall is disposed adjacent to the third sidewall.

9. The optical module according to claim 8, wherein the first counter portion extends along the first sidewall from a connected portion where the first sidewall is connected with the third sidewall, and the second counter portion extends along the third sidewall from the connected portion.

10. The optical module according to claim 6, wherein the housing further comprises a counter corner that faces at least one corner of the cover member.

11. The optical module according to claim 6, wherein a thickness of the second lateral cover surface along the height direction is less than a thickness of the first lateral cover surface along the height direction.

12. The optical module according to claim 6, wherein the resin comprises an ultraviolet curable resin.

13. The optical module according to claim 1, wherein the optical component comprises at least one of a lens, a laser device, an optical fiber, a ferrule, and a photodiode.

14. A method of manufacturing an optical module, the method comprising:
- preparing a cover member that comprises:
  - an opposing surface;
  - a first lateral cover surface perpendicular to the opposing surface; and
  - a second lateral cover surface perpendicular to the opposing surface, wherein
  - the second lateral cover surface is disposed on an opposite side of the first lateral cover surface;
- preparing a housing that comprises:
  - a base portion; and
  - sidewalls extending from the base portion in a height direction to surround the base portion, wherein
  - the sidewalls are exposed to an outside of the optical module, and
  - the sidewalls of the housing comprise:
    - a first sidewall comprising a first counter portion having a first lateral counter surface extending along the height direction; and
    - a second sidewall that faces the first sidewall and that comprises a first cover support surface that supports the cover member,
- mounting an optical component on the base portion;
- applying a resin to a resin application area of the housing that includes the first lateral counter surface of the first sidewall of the housing in at least one cross-section of the housing on a plane parallel to both the height direction and a first direction perpendicular to the height direction;
- disposing the cover member to face the first lateral counter surface of the first sidewall of the housing in a state in which the opposing surface of the cover member faces the base portion on which the optical component has been mounted to bring the first lateral cover surface of the cover member into contact with the resin applied to the first lateral counter surface of the first sidewall of the housing, and also disposing the cover member to face the first cover support surface of the second sidewall of the housing; and
- curing the resin in a state in which the first lateral cover surface of the cover member is brought into contact with the resin applied to the first lateral counter surface of the first sidewall of the housing.

15. The method of manufacturing an optical module according to claim 14, wherein
- the resin comprises an ultraviolet curable resin, and
- the curing of the resin comprises irradiating ultraviolet rays onto the resin.

16. The method of manufacturing an optical module according to claim 14, wherein
- the cover member further comprises:
  - a third lateral cover surface extending along the height direction; and
  - a fourth lateral cover surface extending along the height direction, wherein
  - the fourth lateral cover surface is disposed on an opposite side of the third lateral cover surface,
- the sidewalls of the housing further comprise:
  - a third sidewall comprising a second counter portion having a second lateral counter surface extending along the height direction; and
  - a fourth sidewall that faces the third sidewall, wherein
  - the fourth sidewall comprises a second cover support surface that supports the cover member, and
- the resin application area further includes the second lateral counter surface of the third sidewall of the housing in at least one cross-section of the housing on a plane parallel to both the height direction and a second direction perpendicular to the height direction,
- the disposing of the cover member to face the first lateral counter surface and disposing the cover member to face the cover support surface further comprises disposing the cover member to face the second lateral counter surface of the third sidewall of the housing to bring the third lateral cover surface of the cover member into contact with the resin applied to the second lateral counter surface of the third sidewall of the housing, and also disposing the cover member to face the second cover support surface of the fourth sidewall of the housing, and
- the curing of the resin further comprises bringing the third lateral cover surface of the cover member into contact with the resin applied to the second lateral counter surface of the third sidewall of the housing.

17. The method of manufacturing an optical module according to claim 16, wherein
- the resin comprises an ultraviolet curable resin, and
- the curing of the resin comprises irradiating ultraviolet rays onto the resin.

18. The method of manufacturing an optical module according to claim 14, wherein the optical component comprises at least one of a lens, a laser device, an optical fiber, a ferrule, and a photodiode.

* * * * *